(12) United States Patent
Oda et al.

(10) Patent No.: US 6,474,986 B2
(45) Date of Patent: Nov. 5, 2002

(54) HOT PLATE COOLING METHOD AND HEAT PROCESSING APPARATUS

(75) Inventors: Tetsuya Oda; Mitsuhiro Tanoue; Toshichika Takei; Eiichi Shirakawa, all of Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/832,909

(22) Filed: Apr. 12, 2001

(65) Prior Publication Data
US 2001/0038988 A1 Nov. 8, 2001

Related U.S. Application Data

(63) Continuation-in-part of application No. 09/634,299, filed on Aug. 9, 2000.

(30) Foreign Application Priority Data

Aug. 11, 1999 (JP) .............................. 11-227512
Apr. 13, 2000 (JP) ......................... 2000-112251

(51) Int. Cl.^7 .............................................. F27D 15/02
(52) U.S. Cl. ........................ 432/247; 432/81; 219/405; 118/724; 118/728
(58) Field of Search ..................... 432/5, 6, 81, 230, 432/247; 392/416, 418; 219/390, 404, 405, 411; 118/627, 642, 722, 724, 725, 728

(56) References Cited

U.S. PATENT DOCUMENTS

| | | | |
|---|---|---|---|
| 4,081,313 A | * 3/1978 | McNeilly et al. | 118/724 |
| 5,620,560 A | 4/1997 | Akimoto et al. | 216/41 |
| 5,633,040 A | 5/1997 | Toshima et al. | 427/335 |
| 5,762,745 A | 6/1998 | Hirose | 156/345 |
| 5,778,968 A | * 7/1998 | Hendrickson et al. | 118/725 |
| 5,937,541 A | * 8/1999 | Weigand et al. | 34/565 |
| 6,062,852 A | * 5/2000 | Kawamoto et al. | 392/418 |
| 6,122,439 A | * 9/2000 | Gronet et al. | 392/416 |
| 6,173,116 B1 | * 1/2001 | Roozeboom et al. | 392/416 |
| 6,228,171 B1 | * 5/2001 | Shirakawa | 118/724 |
| 6,259,062 B1 | * 7/2001 | Pan | 219/390 |

* cited by examiner

Primary Examiner—Gregory Wilson
(74) Attorney, Agent, or Firm—Rader, Fishman & Grauer PLLC

(57) ABSTRACT

In a heat processing apparatus structured to heat a wafer on a hot plate, a black plate at least the rear face of which practically has a color with a JIS lightness of 0V to 4V is positioned above the hot plate. Moreover, cooling air is blown out from nozzles onto the rear face of the hot plate. Thus, the temperature of the hot plate can be cooled rapidly.

33 Claims, 19 Drawing Sheets

HOT PLATE COOLING METHOD AND HEAT PROCESSING APPARATUS

This application is a continuation in part application of Ser. No. 09/634,299, filed Aug. 9, 2000, of Tetsuya ODA et al. entitled HOT PLATE COOLING METHOD AND HEAT PROCESSING APPARATUS.

BACKGROUND OF THE INVENTION

1. Field of the Invention

The present invention relates to a method of cooling a hot plate for heating a substrate and a heat processing apparatus.

2. Description of the Related Art

In the process of photo-resist processing in semiconductor device fabrication, various kinds of heat processing such as heat processing (pre-baking) after a resist solution is applied on the front face of a semiconductor wafer (hereinafter referred to as "a wafer"), heat processing (post-exposure baking) after exposure of a pattern is performed, and the like are performed.

Such heat processing is usually performed by a heat processing apparatus. This heat processing apparatus has a disc-shaped thick hot plate made of aluminum in a processing container, and performs heat processing for the wafer by placing the wafer to be processed on the hot plate and heating the hot plate to a predetermined temperature by a heater incorporated in the hot plate.

Incidentally, there are cases where temperatures in heat processing are different, for example, the wafer is heated to 140° C. or the wafer is heated to 90° C. lower than this temperature, depending on the types of semiconductor devices to be formed, types of resist solutions, and types of processes, and the like. In these cases, for example, when the hot plate which has been performing heat processing at 140° C. up to the present is used for heat processing at 90° C., it is required to temporarily lower the temperature of the hot plate, for example, to 90° C., in which case a conventional heat processing apparatus of this type is not specially equipped with a mechanism for cooling and the like, and thus the hot plate is cooled naturally.

However, if cooling is left only to natural cooling when the hot plate is cooled to the predetermined temperature, the temperature in the surface of the hot plate is lowered in an ununiform state, and a considerably long time is required for reaching the predetermined temperature and obtaining uniform surface temperature, which is undesirable. To improve this, if dedicated heat processing apparatus are previously prepared for respective processing temperatures, for example, 140° C. and 90° C., a problem of cooling time can be settled, but if so, a large number of heat processing apparatus become necessary, and as a result, a coating and developing apparatus in which usually a various kinds of resist processing apparatus are put together and used is enlarged, which is undesirable.

SUMMARY OF THE INVENTION

An object of the present invention is to provide a method capable of cooling a hot plate of a heat processing apparatus more rapidly than in prior arts, and a heat processing apparatus having a function capable of suitably carrying out the cooling method.

To attain the aforesaid object, according to a first aspect of the present invention, a hot plate cooling method, comprising the steps of: heating a hot plate for placing a substrate thereon and heating the substrate; and positioning an object of which a portion facing the hot plate has a color with good heat absorption efficiency above the hot plate is provided.

According to the aforesaid structure, the object of which the portion facing the hot plate has a color with good heat absorption efficiency is positioned above the hot plate, whereby radiant heat from the hot plate can be effectively absorbed, resulting in the promotion of cooling of the hot plate and uniform cooling.

According to a second aspect of the present invention, a heat processing apparatus, comprising: a hot plate for heating a substrate; and a nozzle for blowing cooling gas onto a rear face of the hot plate is provided.

According to the aforesaid structure, the temperature of the hot plate can be lowered more rapidly than in the prior arts, and moreover dust and the like do not adhere to a substrate mounting face since air is blown onto the rear face side of the hot plate.

According to a third aspect of the present invention, a heat processing apparatus, comprising: a hot plate for heating a substrate; and an object moving freely over the hot plate, of which a face opposite the hot plate has a color with good heat absorption efficiency is provided.

According to the aforesaid structure, the object of which the portion facing the hot plate has a color with good heat absorption efficiency can be positioned above the hot plate, whereby radiant heat from the hot plate can be effectively absorbed, resulting in the promotion of cooling of the hot plate and uniform cooling.

According to a fourth aspect of the present invention, an apparatus for performing heat processing for a substrate, comprises: a plate for holding the substrate; a heater for heating the plate; a cooling container containing a refrigerant; a cooling module, disposed to touch at least one face of the cooling container, for absorbing a heat from the cooling container to cool the refrigerant in the cooling container to a predetermined temperature by a Peltier effect; a supply source of a cooling gas; a cooling gas channel connected to the supply source, a portion of which is provided to touch the refrigerant in the cooling container and cooled by touching the refrigerant; and a nozzle for jetting the cooling gas which has passed through the cooling gas channel toward the plate.

In the aforesaid structure, the cooling gas cooled by the Peltier effect is supplied to the hot plate, thereby enhancing the cooling efficiency of the hot plate, and consequently the temperature of the hot plate can be lowered to a predetermined temperature in a short time.

According to a fifth aspect of the present invention, an apparatus for forming a resist pattern on a substrate, comprises: a coating processing unit for coating a front face of the substrate with a resist; a developing processing unit for supplying a developing solution to the front face of the substrate subjected to exposure to develop the same; a heat processing unit for heating the substrate after exposure to a predetermined temperature; and a substrate carrier for transferring the substrate between the coating processing unit, the developing processing unit, and the heat processing unit, the heat processing unit, comprising: a plate for holding the substrate; a heater for heating the plate; a cooling container containing a refrigerant; a cooling module, disposed to touch at least one face of the cooling container, for absorbing a heat from the cooling container to cool the refrigerant in the cooling container to a predetermined temperature by a Peltier effect; a supply source of a cooling gas; a cooling gas channel connected to the supply source, a portion of which is provided to touch the refrigerant in the cooling container and cooled by touching the refrigerant; and a nozzle for jetting the cooling gas which has passed through the cooling gas channel toward the plate.

According to the aforesaid structure, the temperature of the hot plate in the heat processing unit can be regulated in a short time, leading to a rise in throughput.

In a sixth aspect of the present invention, a method for forming a resist pattern on a substrate, comprises: a first resist pattern forming step of performing exposure processing for a substrate coated with a resist by use of a first reticle, heating the exposed substrate by a hot plate heated to a first temperature, and thereafter supplying a developing solution to a front face of the substrate to develop the same; a second resist pattern forming step of performing exposure processing for a substrate coated with the resist by use of a second reticle, heating the exposed substrate by the hot plate heated to a second temperature lower than the first temperature, and thereafter supplying the developing solution to a front face of the substrate to develop the same; a step of exchanging the first reticle for the second reticle, which is performed between the first resist pattern forming step and the second resist pattern forming step; a step of absorbing a heat from a cooling container by a Peltier effect of a cooling module to cool a refrigerant in the cooling container to a predetermined temperature; and a step of providing a cooling gas channel so that the cooling gas channel touches the refrigerant in the cooling container and supplying a cooling gas which is cooled by flowing through the cooling gas channel to the hot plate to lower the temperature of the hot plate from the first temperature to the second temperature.

In a seventh aspect of the present invention, a method for forming a resist pattern on a substrate, comprises: a first resist pattern forming step of performing exposure processing for a substrate coated with a resist by use of a first reticle, heating the exposed substrate by a hot plate heated to a first temperature, and thereafter supplying a developing solution to a front face of the substrate to develop the same; a second resist pattern forming step of performing exposure processing for a substrate coated with the resist by use of a second reticle, heating the exposed substrate by the hot plate heated to a second temperature lower than the first temperature, and thereafter supplying the developing solution to a front face of the substrate to develop the same; a step of exchanging the first reticle for the second reticle, which is performed between the first resist pattern forming step and the second resist pattern forming step; a step of absorbing a heat from a cooling container by a Peltier effect of a cooling module to cool a refrigerant in the cooling container to a predetermined temperature, which is performed during the first resist pattern forming step; and a step of providing a cooling gas channel so that the cooling gas channel touches the refrigerant in the cooling container and supplying a cooling gas which is cooled by flowing through the cooling gas channel to the hot plate to lower the temperature of the hot plate from the first temperature to the second temperature, which is performed during the step of exchanging the reticles.

According to these methods, the refrigerant in the cooling container is cooled to the predetermined temperature during the first resist pattern forming step, and the cooled cooling gas is supplied to the hot plate to lower the temperature of the hot plate from the first temperature to the second temperature during the step of exchanging the reticles, whereby the time to wait for temperature regulation of the hot plate need not be provided specially, resulting in improvement in throughput.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
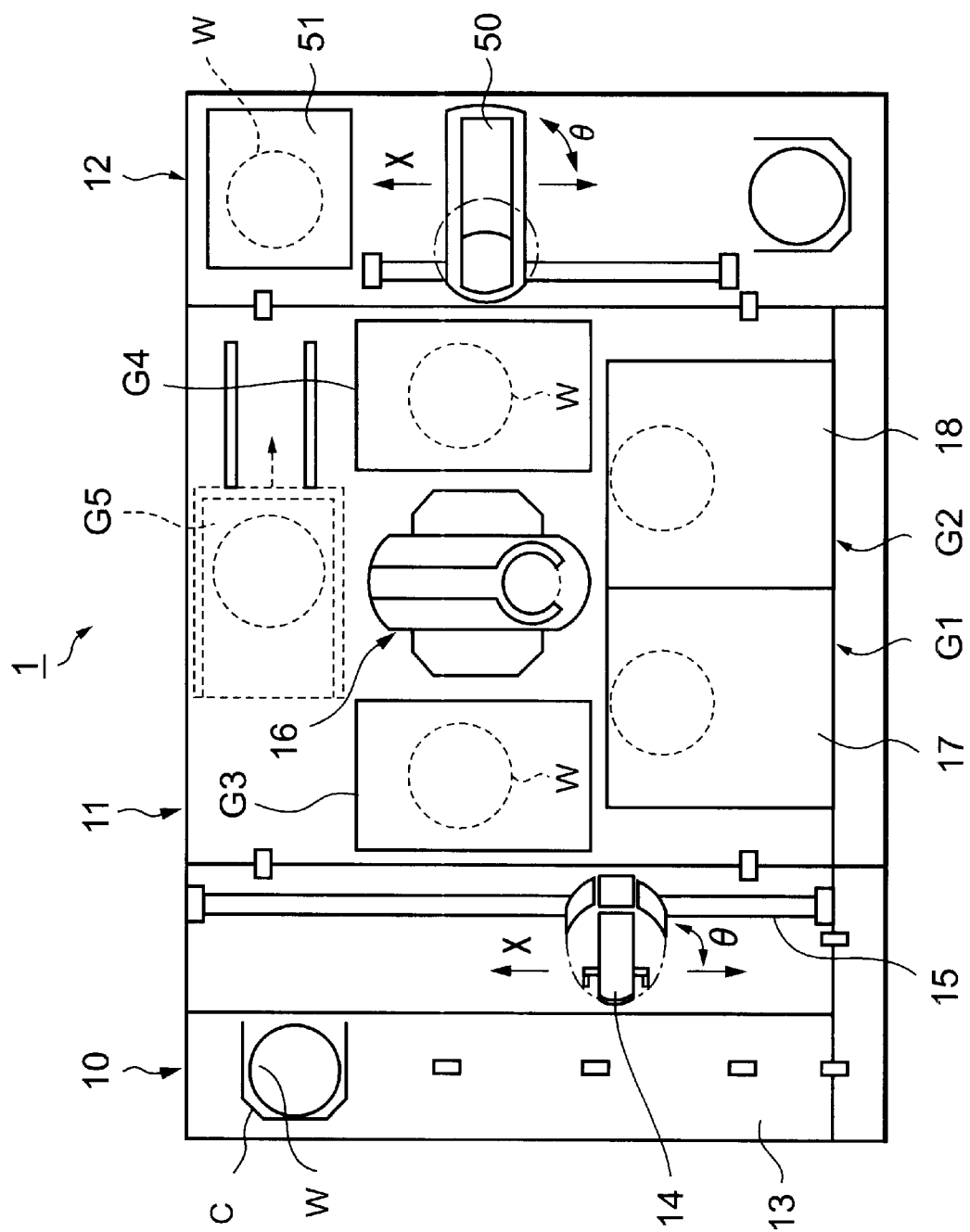
FIG. 1 is a plan view of a coating and developing processing apparatus in which a heating and cooling processing unit according to an embodiment of the present invention is incorporated.
Figure 2:
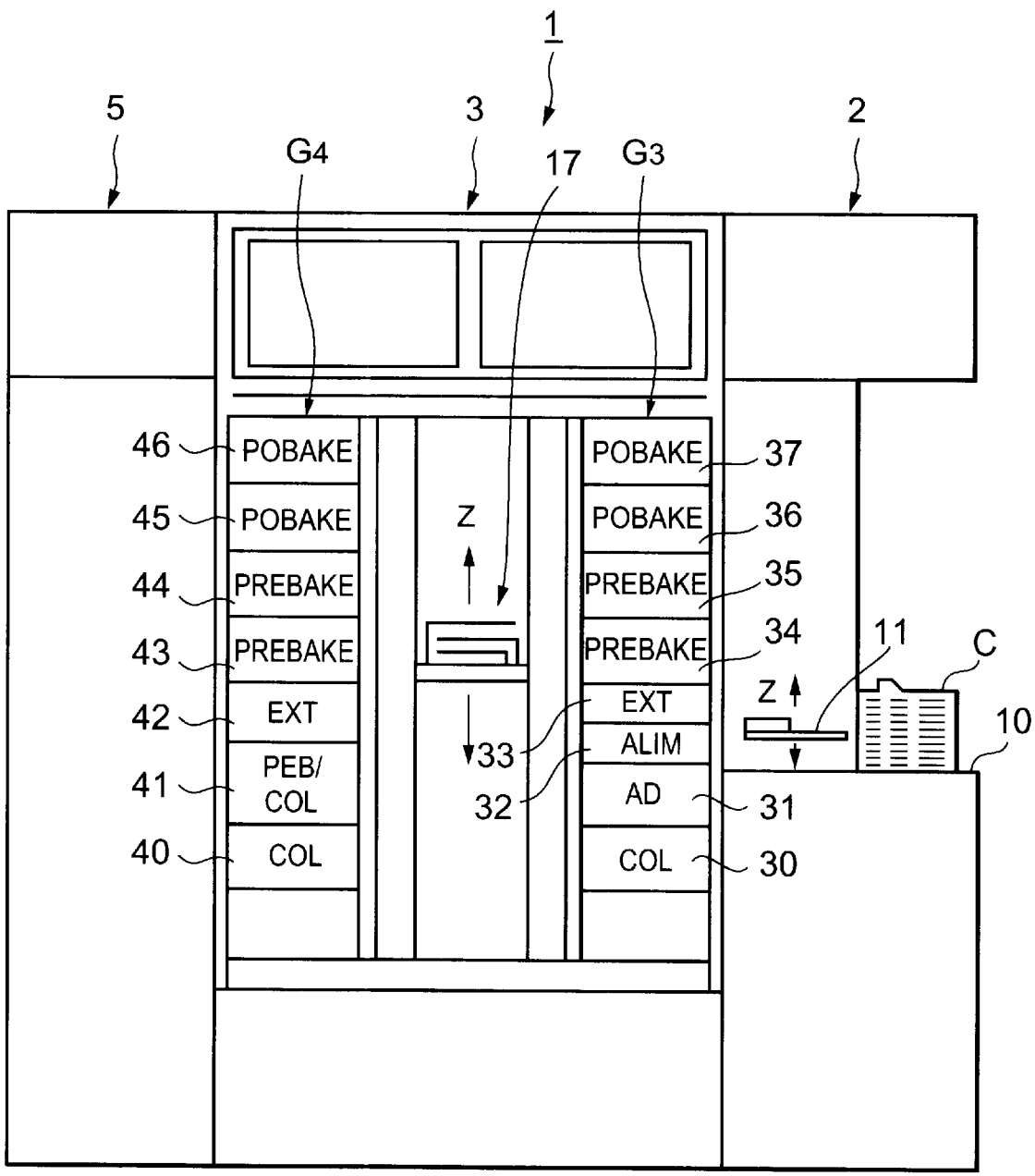
FIG. 2 is a rear view of the coating and developing processing apparatus in FIG. 1.

A Preferred embodiment of the present invention will be described below. FIG. 1 is a plan view of a coating and developing processing apparatus 1 in which an apparatus according to this embodiment is incorporated. FIG. 2 is a rear view of the coating and developing processing apparatus 1. This coating and developing processing apparatus 1 has structure in which a cassette station 10 for transferring, for example, 25 wafers W per cassette C, as a unit, from/to the outside into/from the coating and developing processing apparatus 1 and carrying the wafer W into/out of the cassette C, a processing station 11 in which various kinds of processing units each for performing predetermined processing for the wafers W one by one in coating and developing processes are multi-tiered, and an interface unit 12 for receiving and sending the wafer W from/to an aligner (not illustrated) provided adjacent to the processing station 11 are integrally connected.

In the cassette station 10, cassettes C can be freely mounted in a line in an X-direction (a top-to bottom direction in FIG. 1) at predetermined positions on a cassette mounting table 13. A wafer transfer body 14 movable in the X-direction and in the direction of arrangement of the wafers W housed in the cassette C (a Z-direction; vertical direction) is provided along a transfer path 15 to be able to selectively get access to each of the cassettes C.

The wafer transfer body 14 is also structured to be able to get access to an alignment unit 32 and an extension unit 33 which are included in a third processing unit group G3 on the processing station 11 side as will be described later.

In the processing station 11, a main transfer device 16 is provided in the middle thereof, and various kinds of processing units are multi-tiered to compose processing unit groups around the main transfer device 16. In the coating and developing processing apparatus 1, four processing unit groups G1, G2, G3, and G4 are arranged. The first and second processing unit groups G1 and G2 are arranged at the front of the coating and developing processing apparatus 1, the third processing unit group G3 is arranged adjacent to the cassette station 10, and the fourth processing unit group G4 is arranged adjacent to the interface unit 12. It should be mentioned that as an option, a fifth processing unit group G5 shown by the broken line can be separately arranged at the back.

In the first processing unit group G1 and the second processing unit group G2, spinner-type processing units, for example, resist coating units 17 and 18 each for applying a resist to the wafer W to process the wafer W and developing processing units (not illustrated) for supplying a developing solution to the wafer W to process the wafer W are two-tiered from the bottom in order respectively.

In the third processing unit group G3, as shown in FIG. 2, oven-type processing units each for performing predetermined processing while the wafer W is placed on a mounting table, for example, a cooling unit (COL) 30 for performing cooling processing, an adhesion unit (AD) 31 for enhancing adhesion of a resist solution and the wafer W, an alignment unit (ALIM) 32 for aligning the wafer W, an extension unit (EXT) 33 for making the wafer W wait, pre-baking units (PREBAKE) 34 and 35 each for performing heat processing before exposure processing, and post-baking units (POBAKE) 36 and 37 for performing heat processing after developing processing, or the like are eight-tiered from the bottom in order.

In the fourth processing unit group G4, for example, a cooling unit (COL) 40, a heating and cooling processing unit 41 as a heat processing apparatus according to this embodiment, an extension unit (EXT) 42, pre-baking units (PREBAKE) 43 and 44, post-baking units (POBAKE) 45 and 46, or the like are seven-tiered from the bottom in order.

A wafer transfer body 50 is provided in the middle of the interface unit 12. The wafer transfer body 50 is structured to be able to get access to the extension unit 42 included in the fourth processing unit group G4, a peripheral edge aligner 51, and the pattern aligner (not illustrated).

Figure 3:
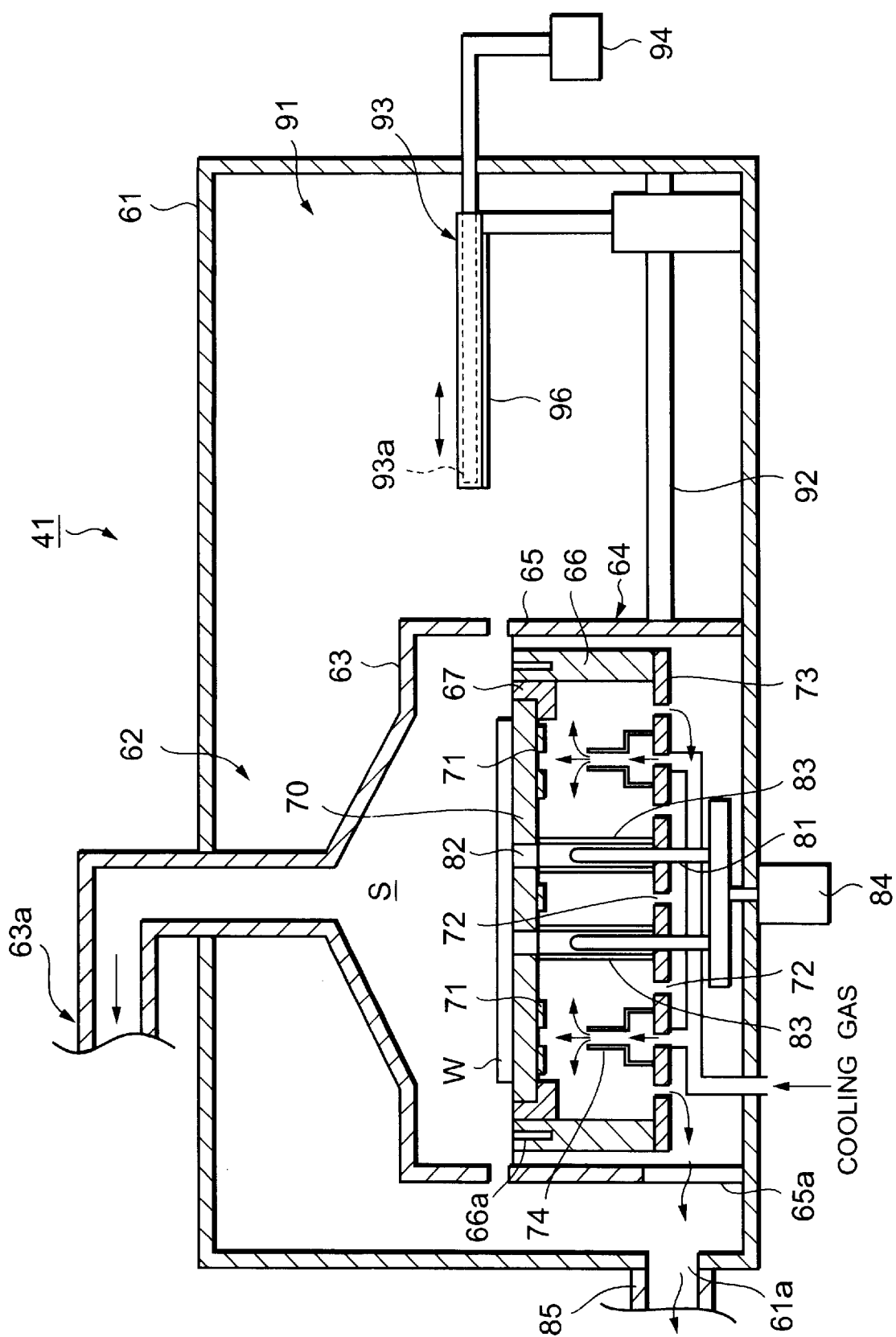
FIG. 3 is a side sectional view of the heating and cooling processing unit according to the embodiment.

Next, the aforesaid heating and cooling processing unit 41 will be explained in detail by means of FIG. 3 and FIG. 4. As shown in FIG. 3, the heating and cooling processing unit 41 has a heating unit 62 inside a casing 61, and the heating unit 62 is composed of a lid body 63, which is situated at the upper side and movable up and down, and a hot plate container 64 which is situated at the lower side and forms a processing chamber S integrally with the lid body 63.

The lid body 63 has an almost conical shape gradually elevated toward the center and is provided with an exhaust 63a at the top thereof, and an atmosphere in the processing chamber S is uniformly exhausted from the exhaust 63a.

The hot plate container 64 has an almost cylindrical case 65 at the outer periphery thereof, an almost cylindrical inner case 66 disposed inside the case 65, a support ring 67 with good heat insulating properties fixed in the inner case 66, and a disc-shaped hot plate 70 supported by the support ring 67. An air outlet 66a is provided in the upper face of the inner case 66, and, for example, air, an inert gas, or the like can be blown out into the processing chamber. The processing chamber has spaces in the upper and lower portions thereof with a hot plate 70 between them.

The hot plate 70 is made of, for example, aluminum. Attached to the rear face thereof are heaters 71 which generate heat by electrical supply. Attached to the lower face of the inner case 66 is a perforated base plate 73 in which a large number of ventilators 72 are formed, for example, like a punching metal.

Nozzles 74 for blowing out cooling gas, for example, normal temperature air in the vertical direction toward the rear face of the hot plate 70 are provided at eight points on the base plate 73. As shown in FIG. 4, the arrangement of the nozzles 74 is set so that each four nozzles are situated concentrically and that their positions do not overlap with the positions of temperature sensors 75 for temperature measurement of the hot plate 70 (shown by the symbol x in FIG. 4) in plan view. The nozzles 74 communicate with one another by an air supply pipe 76, and when air is supplied from the outside of the casing 61, air with the same air velocity is blown onto the rear face of the hot plate 70 from each of the nozzles 74.

Through-holes 82 through which three ascending and descending pins 81 protrude from the hot plate 70 when the wafer W is raised and lowered are formed at three points in the hot plate 70. Between the through-holes 82 and the base plate 73, cylindrical guides 83 for isolating the ascending and descending pins 81 from the atmosphere around the nozzles 74 by covering the outer peripheries of the ascending and descending pins 81 are disposed vertically. Thanks to these guides 83, the vertical motion of the ascending and descending pins 81 is not impeded by various cords laid under the hot plate 70, and air blown out from the nozzles 74 is prevented from discharging from the through-holes 82 toward the wafer W. The ascending and descending pins 81 are vertically movable by a proper drive unit 84 such as a motor or the like.

A proper exhaust port 65a is formed around the lower portion of the case 65, and also a proper exhaust port 61a is formed beside the lower portion of the casing 61 of the heating and cooling processing unit 41. An exhaust pipe 85 leading to an exhauster (not illustrated) intensively exhausting air from other processing units of the aforesaid coating and developing processing apparatus 1 is connected to the exhaust port 61a.

Inside the casing 61, a cooling unit 91 is provided in addition to the heating unit 62 having the aforesaid main structure. The cooling unit 91 has a chill plate 93 which functions also as a transfer device in the casing 61, movable along a moving rail 92 and vertically.

Figure 4:
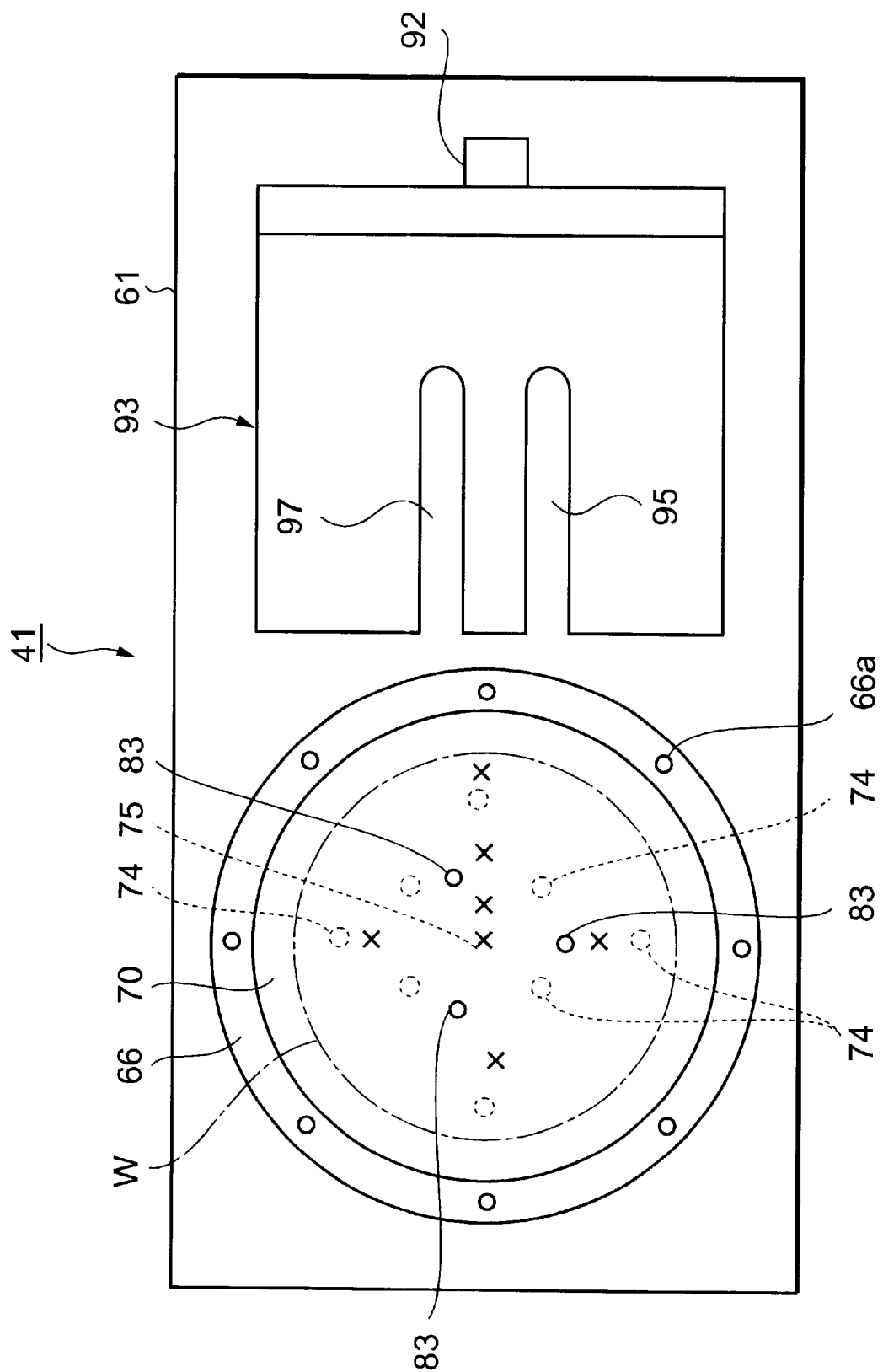
FIG. 4 is a plan view of the heating and cooling processing unit according to the embodiment.
Figure 5:
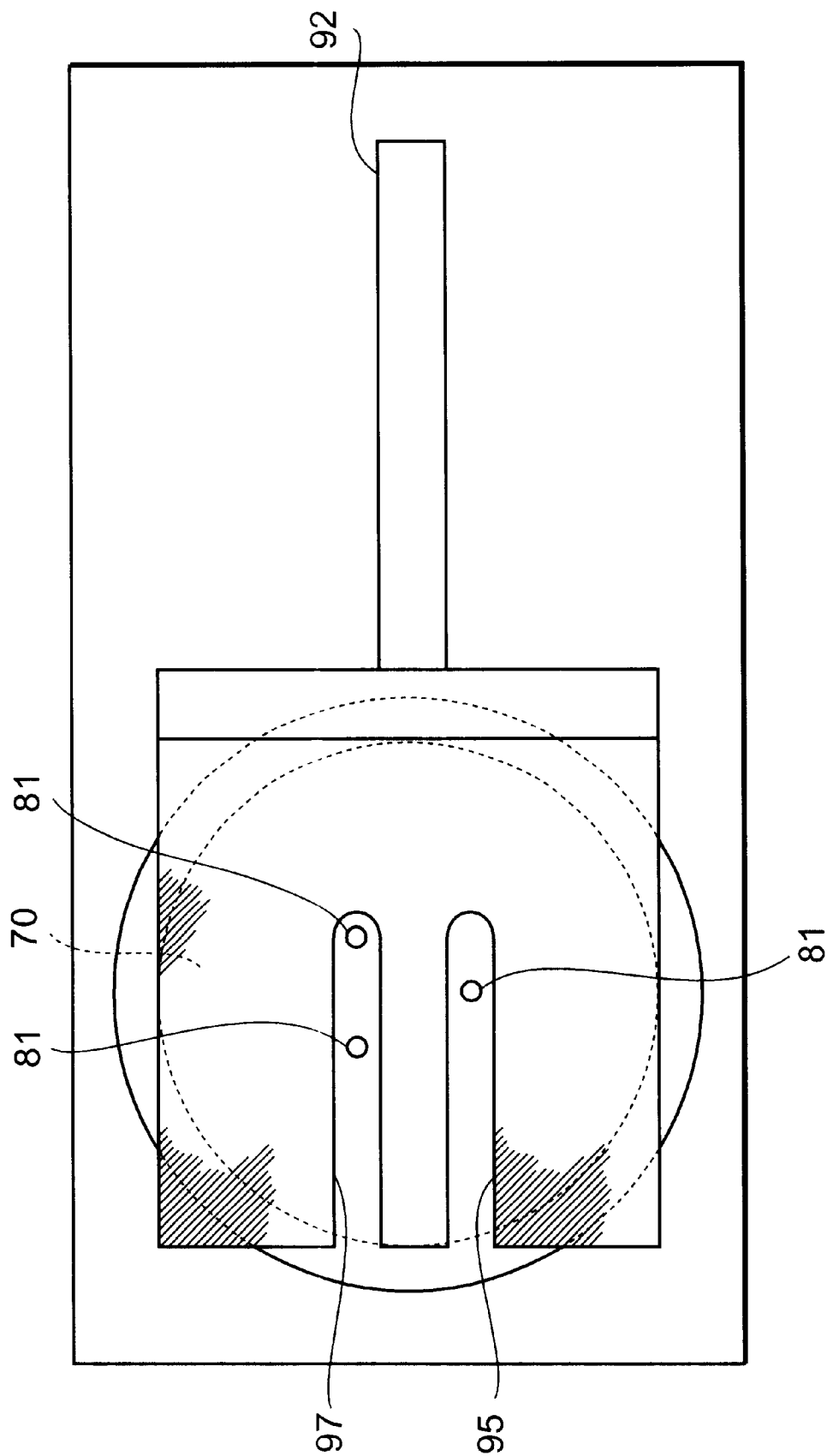
FIG. 5 is a plan view showing the state in which a chill plate in the heating and cooling processing unit according to the embodiment is moved onto a hot plate.

As shown in FIG. 4, the chill plate 93 has an almost square flat plate-shape as a whole, and has structure in which inside the chill plate 93, liquid having a predetermined temperature (23° C., for example) supplied from a constant temperature water supply source 94 provided outside, for example, constant temperature water circulates in a circulating channel 93a in the chill plate 93 to cool the wafer W mounted on the chill plate 93. Slits 95 and 97 are formed at an end on the heating unit 62 side in the chill plate 93. These slits 95 and 97 are provided so that the ascending and descending pins 81 are not obstacles when the chill plate 93 moves to the heating unit 62 side and is situated on the hot plate 70 as shown in FIG. 5 in order to receive the wafer W on the hot plate 70 supported by the ascending and descending pins 81. Therefore, the chill plate 93 can move freely on the hot plate 70 as shown in FIG. 5.

Figure 6:
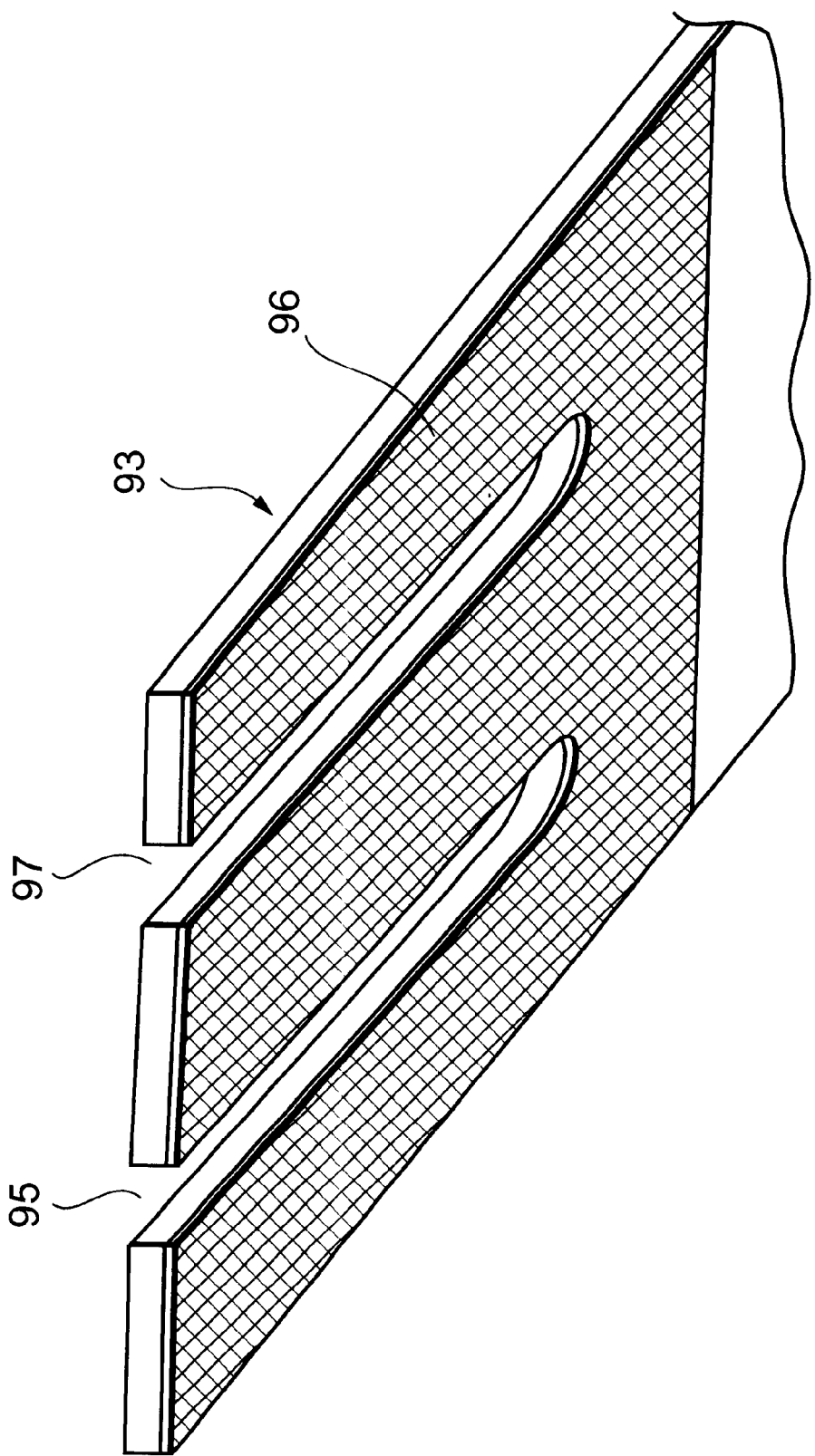
FIG. 6 is a perspective view seen obliquely from below of a black plate in the heating and cooling processing unit according to the embodiment.

As shown in FIG. 6, a black plate 96 is closely attached to the rear face of the chill plate 93, that is, a face which is opposite the hot plate 70 when the chill plate is situated on the hot plate 70. The black plate 96 is made of ceramic or the like, and the color has lightness standardized by JIS, practically in the range of 0V to 4V. The surface (the underside) of the black plate 96 is formed into a roughened surface on which minute recesses and projections are formed, thereby preventing reflection. Incidentally, black is adopted as a color with good heat absorption efficiency in this embodiment, but not limited to this, various kinds of colors such as dark brown, green, blue, and the like can be used if they are dark colors having a JIS lightness of 0V to 4V. The color, having lightness within this range, has good heat absorption efficiency. As for a color with good heat absorption efficiency, the hot plate may be colored or plated with paint or the like, the hot plate itself may be composed of a material of any of the aforesaid colors, or a plate or a film of any of the aforesaid colors may be attached to the surface of the hot plate. Moreover, it is preferable that the hot plate itself is composed of a material with good heat conductivity, for example, metal.

The heating and cooling processing unit 41 according to this embodiment is structured as above, and undertakes post-exposure baking (PEB) and the subsequent cooling processing after exposure of a pattern is performed in the aligner (not illustrated) adjacent to the coating and developing processing apparatus 1. Namely, a chemically amplified resist which is widely used these days needs immediate cooling as well as heat processing after the completion of exposure of a pattern, and the heating and cooling processing unit 41 according to this embodiment satisfies the aforesaid need. More specifically, when the wafer W which has undergone exposure processing is placed on the hot plate 70, the wafer W is heated to 140° C. by the heater 71, for example. When heating for a predetermined period of time is completed, the ascending and descending pins 81 ascend and support the wafer W. In this state, the chill plate 93 moves onto the hot plate 70 and receives the wafer W at which time constant temperature water is circulating in the chill plate 93, and immediately after the wafer W is received by the chill plate 93, cooling processing is started. Accordingly, post-exposure baking (PEB) after exposure is performed swiftly.

Incidentally, temperatures of post-exposure baking are different depending on the processes and types of resists. Hence, not only the case of heating at 140° C. as described above, but also the case of heating at a temperature lower than 140° C., for example, at 90° C. is possible. In this case, it is required to rapidly cool the hot plate 70 to prepare for heating at 90° C., and the heating and cooling processing unit 41 according to this embodiment can suitably cope with such temperature drop of the hot plate.

Figure 7:
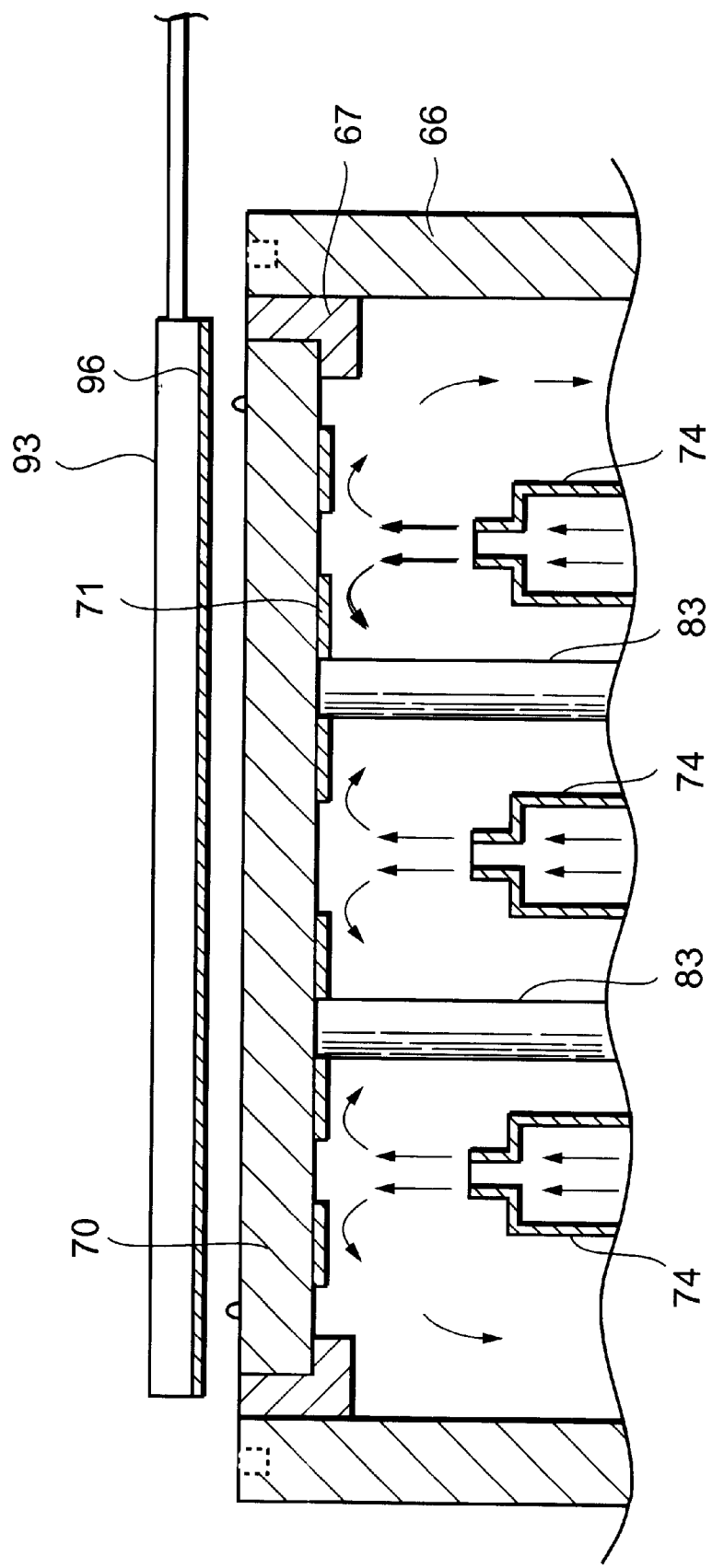
FIG. 7 is a side sectional view showing the state in which the chill plate in the heating and cooling processing unit according to the embodiment is moved onto the hot plate.

More specifically, after heating and cooling processing of the last wafer in a lot which is subjected to heat processing at 140° C. is completed, the chill plate 93 is moved onto the hot plate 70 as shown in FIG. 5. Concurrently with this, as shown in FIG. 7, air with a normal temperature of about 23° C. is blown out from the nozzles 74 onto the rear face of the hot plate 70. Then, the hot plate 70 is first cooled by the normal-temperature air blown onto the rear face thereof. Although the temperature of air discharged from the nozzles 74 is set at 23° C., such temperature that moisture condensation does not occur is desirable. Regarding the temperature of blown gas, gas with a low temperature can improve cooling rate as a matter of course, but gas with normal temperature also can obtain great results as in this embodiment. The gas may be air or any of various kinds of inert gases including nitrogen gas, but preferably the use of dry air from which moisture is removed is recommended.

Meanwhile, since the black plate 96 attached to the rear face of the chill plate 93 covers the front face of the hot plate 70, radiant heat from the front face of the hot plate 70 is absorbed efficiently by this black plate 96. The black plate 96 itself is closely attached to the chill plate 93 which is always cooled by constant-temperature circulating water, and thus the black plate 96 itself is indirectly cooled by the constant-temperature water. Hence, the black plate 96 can continuously and efficiently absorb radiant heat from the hot plate and hot air from the hot plate 70 and cool the hot plate rapidly.

Moreover, since the black plate 96 covers the entire front face of the hot plate 70, it can absorb radiant heat uniformly. Thus, the temperature of the hot plate 70 can be lowered uniformly. As described above, the surface of the black plate 96 is formed into a roughened surface, thereby making it possible to prevent reflection and to absorb radiant heat more efficiently. In this embodiment, the use of the black plate 96, the surface of which is roughened, enables the time required for a change in the temperature of the hot plate 70 by 50° C. to be shortened from conventional 180 seconds to 30 seconds.

In this embodiment, the chill plate 93 to which the black plate 96 is attached serves both as a transfer device for transferring a substrate and a cooling object for absorbing radiant heat from the hot plate, and therefore it is unnecessary to provide a cooling object specially. Incidentally, not limited to the structure explained above, usually, in a heat processing apparatus, a substrate is carried into/out of the heat processing apparatus by using a transfer device, and hence it is possible to effectively utilize the transfer device. Moreover, the black plate 96 is shaped almost exactly into a flat plate to cover the hot plate, and thus can cool the hot plate efficiently.

As described above, the black plate 96 efficiently absorbs radiant heat from the front face of the hot plate 70, whereas air is blown out from the nozzles 74 onto the rear face of the hot plate 70, which makes it possible to very rapidly lower the temperature of the hot plate 70 to a predetermined temperature, for example, 90° C. Consequently, it becomes possible to promptly cope with heating at 90° C. Air from the nozzles 74 is blown onto the rear face of the hot plate, whereby dust and the like do not adhere to the front face of the hot plate, that is, a substrate mounting face.

Air blown out from the nozzles 74 can pass through the vent holes 72 of the base plate 73, and can be exhausted to the outside from the exhaust pipe 85 via the exhaust ports 65a and 61a, and thereby does not remain in a space under the hot plate 70. Accordingly, also in this regard, the cooling effect of the hot plate 70 is high. The positions at which air is blown out from the nozzles 74 are set at positions away from the temperature sensors 75, whereby the measurement of the temperature of the hot plate 70 by the temperature sensors 75 is not impeded.

In this embodiment, cooling of the hot plate 70 is performed by positioning the black plate 96 above the hot plate 70 and blowing air from the nozzles 74 onto the hot plate 70. In this case, when the temperature of the hot plate 70 reaches a temperature which is a set temperature plus 1.5° C., the chill plate 93 is moved and returned to the cooling unit 91. Thereafter, when the temperature of the hot plate 70 reaches a temperature which is the set temperature plus 0.3° C., the supply of air from the nozzles 74 is stopped. By stopping cooling processing at a temperature slightly higher than the set temperature as described above, the occurrence of overshoot in which the temperature of the hot plate 70 is excessively lower than the set temperature is prevented.

It is desirable that the discharge quantity of air discharged from the nozzles 74 is more than the exhaust quantity of air from the exhaust port 65a. Thereby, the inside of a space surrounded by the hot plate 70, the inner case 66, the support ring 67, and the base plate 73 is maintained at a positive pressure, whereby air can be uniformly supplied into the space, and hence air can be uniformly blown onto the surface of the hot plate 70. Consequently, the surface of the hot plate 70 can be cooled uniformly.

Although the aforesaid embodiment is embodied as the heating and cooling processing unit, the structure of a heat processing apparatus alone is suitable as a matter of course. Moreover, although the wafer is used as a substrate, the present invention can be applied to a heat processing apparatus for other square substrates, for example, an LCD substrate.

As described above, in the heat processing apparatus in this embodiment, the temperature of the hot plate can be lowered more rapidly and uniformly than in prior arts. Therefore, even when one heat processing apparatus is used also for heat processing at different temperatures, less time is needed for the change of setting to a different temperature than in the prior arts, resulting in contribution to improvement in throughput.

Aluminum is used as a hot plate in the aforesaid embodiment, but ceramics having the same heat conductivity as aluminum may be used.

Furthermore, in the aforesaid embodiment, a hot plate with a thickness of three millimeters can be used as the hot plate, and the rate of temperature drop of the hot plate can be quickened by decreasing the thickness as described above.

Figure 8:
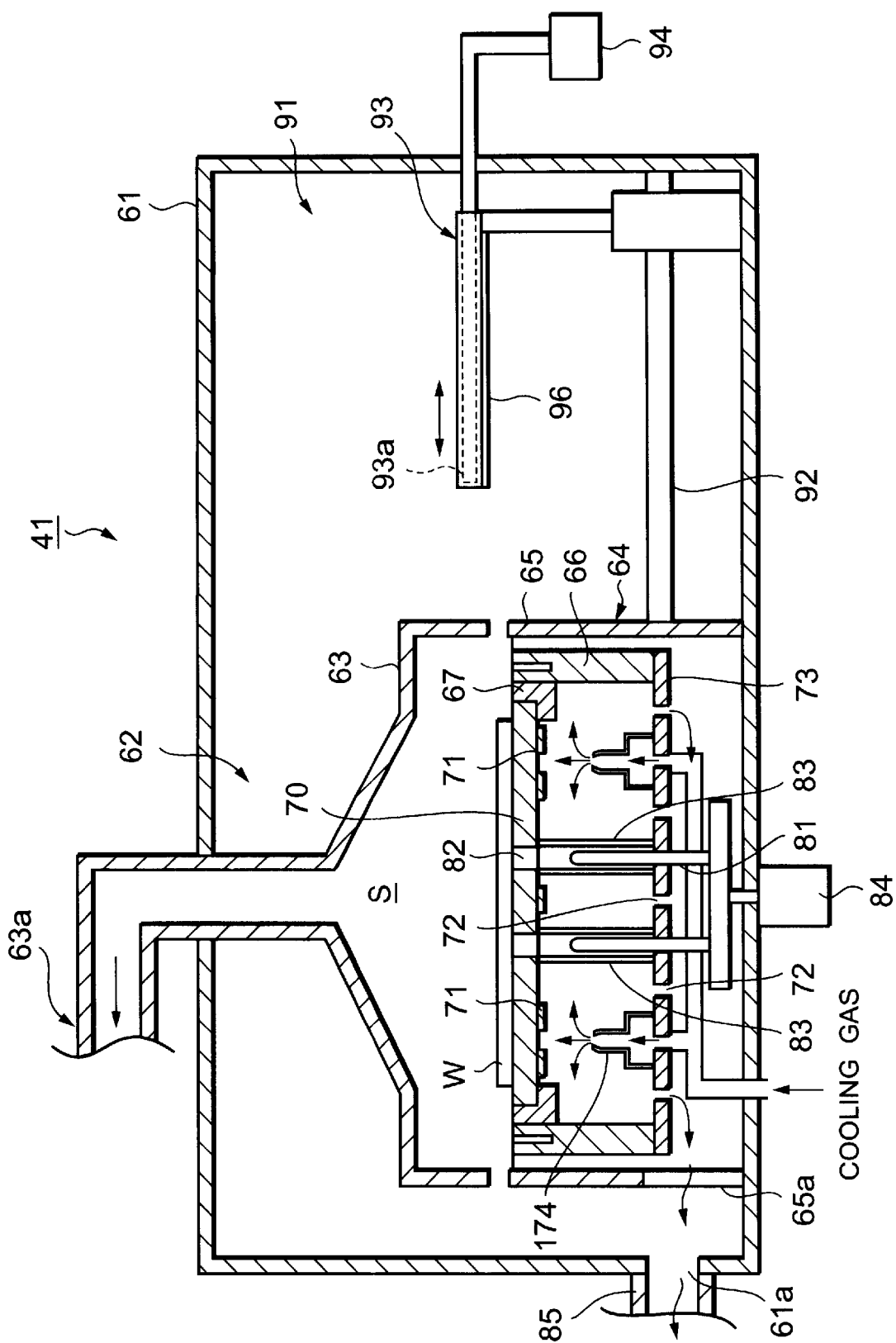
FIG. 8 is a side sectional view of a heating and cooling processing unit according to another embodiment.

Moreover, in the aforesaid embodiment, the tip of the nozzle 74 has such a shape that the diameter of the nozzle 74 does not change along the lengthwise direction of the nozzle 74. But, as shown in FIG. 8, such a shape that the diameter of a nozzle 174 changes along the lengthwise direction of the nozzle 174 by narrowing the tip of the nozzle 174 is also suitable. The use of the nozzle 174 the tip portion of which is narrowed as described above makes more uniform cooling possible.

Figure 9:
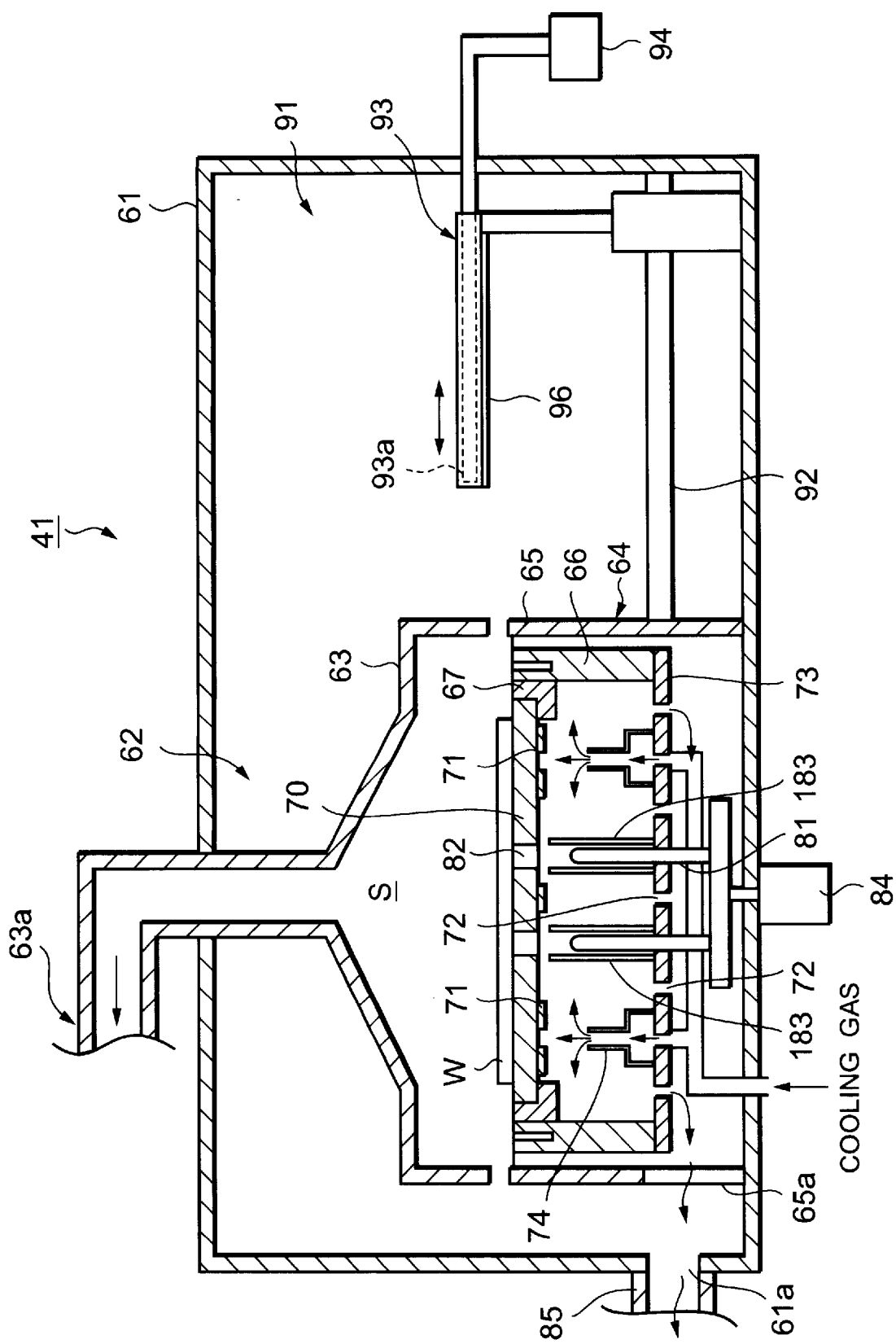
FIG. 9 is a side sectional view of a heating and cooling processing unit according to still another embodiment.

Although the guides 83 are disposed touching the hot plate 70, guides 183 and the hot plate 70 may be disposed a predetermined space apart from each other as shown in FIG. 9. If the guides 83 and the hot plate 70 touch, heat from the hot plate 70 escapes to the guides 83, and as a result, the temperature of the hot plate 70 around the positions of the ascending and descending pins 81 changes, and the hot plate 70 has ununiform temperature distribution in the surface thereof. Such ununiform temperature distribution becomes marked as the hot plate 70 has a smaller thickness as thin as 3 mm, but the amount of gas escaping from the hot plate 70 to the guides 83 can be reduced by disposing the guides 83 and the hot plate 70 apart from each other as shown in FIG. 9, thereby allowing temperature distribution in the surface of the hot plate 70 to be made uniform.

Figure 10:
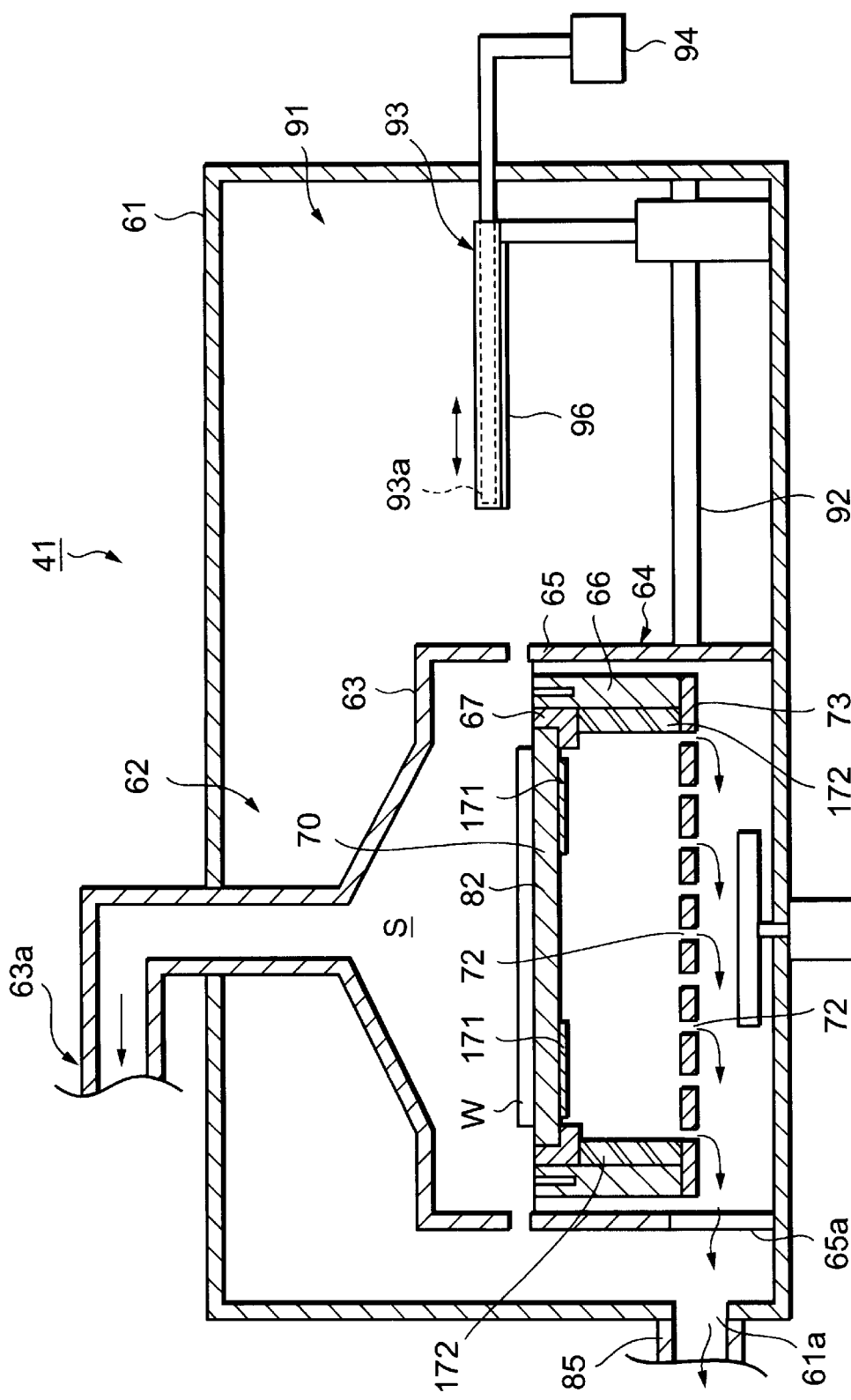
FIG. 10 is a side sectional view of a heating and cooling processing unit according to yet another embodiment.
Figure 11:
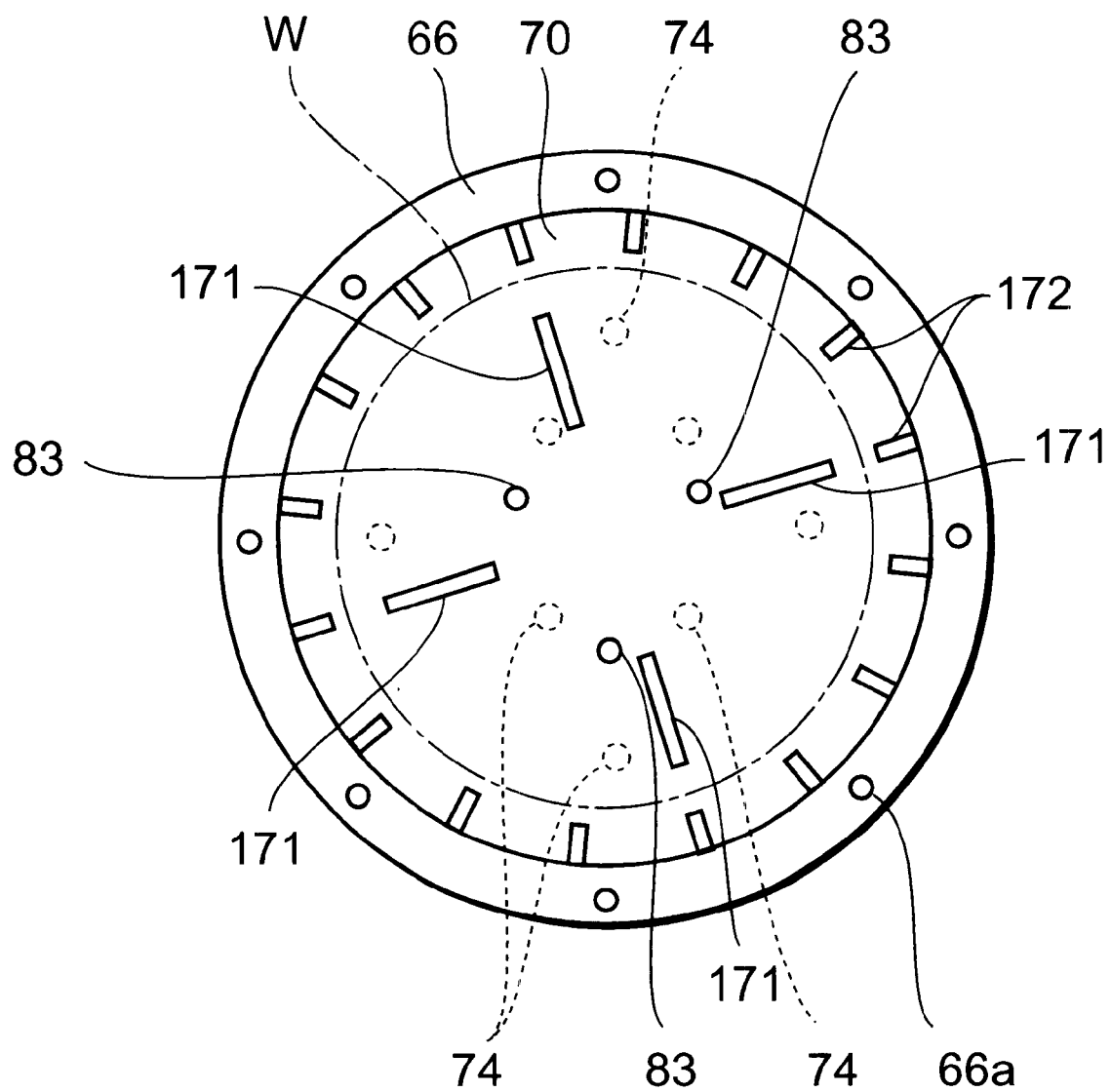
FIG. 11 is a plan view of the heating and cooling processing unit in FIG. 10.

In addition to the structure of the aforesaid embodiment, as shown in FIG. 10 and FIG. 11, a plurality of fins 171 and 172 may be provided radially on the rear face of the hot plate 70 and the inner side face of the inner case 66 respectively. The provision of the fins 171 and 172 makes it possible to enlarge an area in which the hot plate 70 and the inner case 66, and air discharged from the nozzles 74 touch, thereby raising the cooling effect of the hot plate 70. Incidentally, FIG. 10 is a side sectional view of the heating and cooling processing unit and different from FIG. 3 in section position. FIG. 11 is a plan view of the heating and cooling processing unit.

Figure 12:
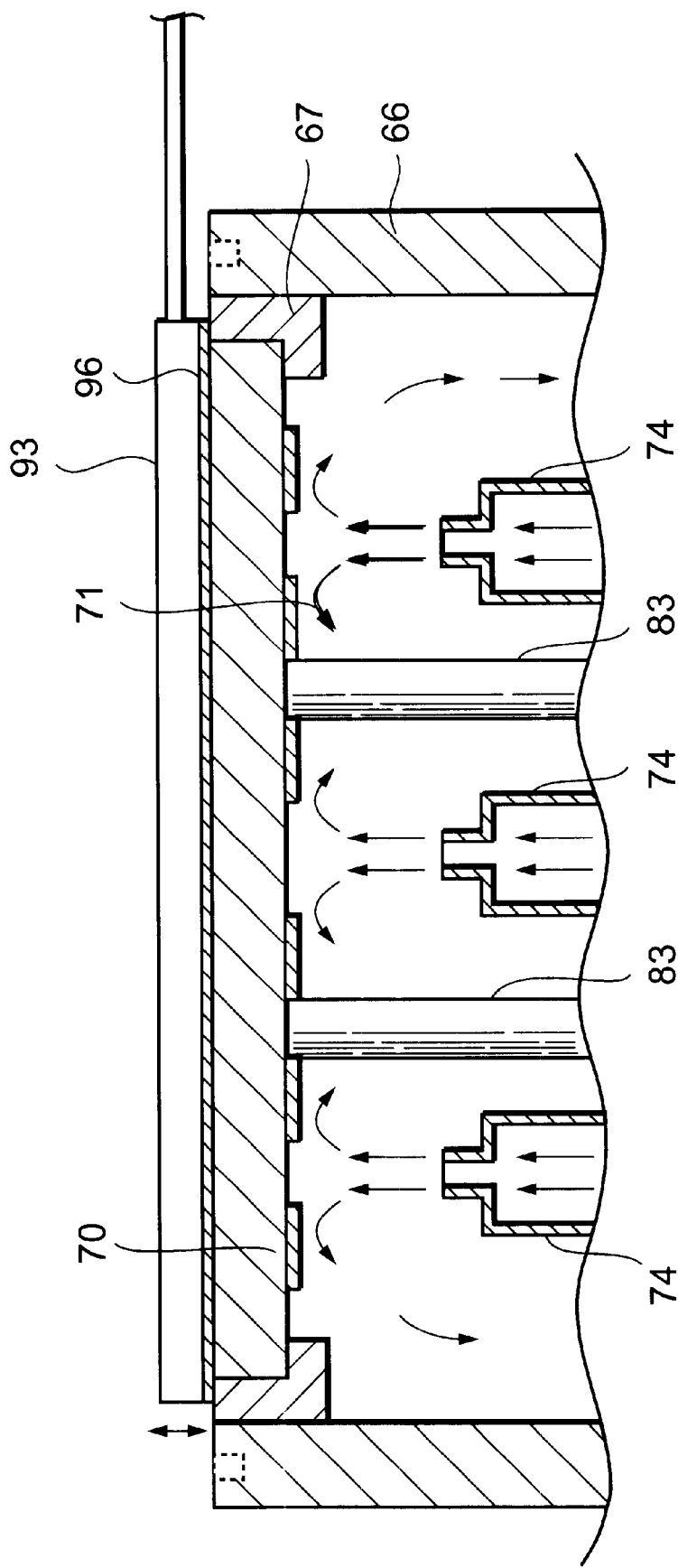
FIG. 12 is a side sectional view showing the state in which a chill plate in a heating and cooling processing unit according to still another embodiment is moved onto a hot plate.

In the aforesaid embodiment, in the state in which the cooling plate 93 is moved onto the hot plate 70, the hot pate 70 and the cooling plate 93 are placed apart from each other. But, it is possible that the cooling plate 93 is designed to be ascendable and descendable, and that the hot plate 70 can be cooled by making the cooling plate 93 and the hot plate 70 touch as shown in FIG. 12, and consequently the cooling rate can be improved as compared with the case where they are apart from each other. In this case, when the hot plate 70 reaches a temperature higher than the predetermined temperature after the cooling plate 93 and the hot plate 70 touch, the cooling plate 93 and the hot plate 70 are separated, whereby overshoot can be prevented.

Figure 13:
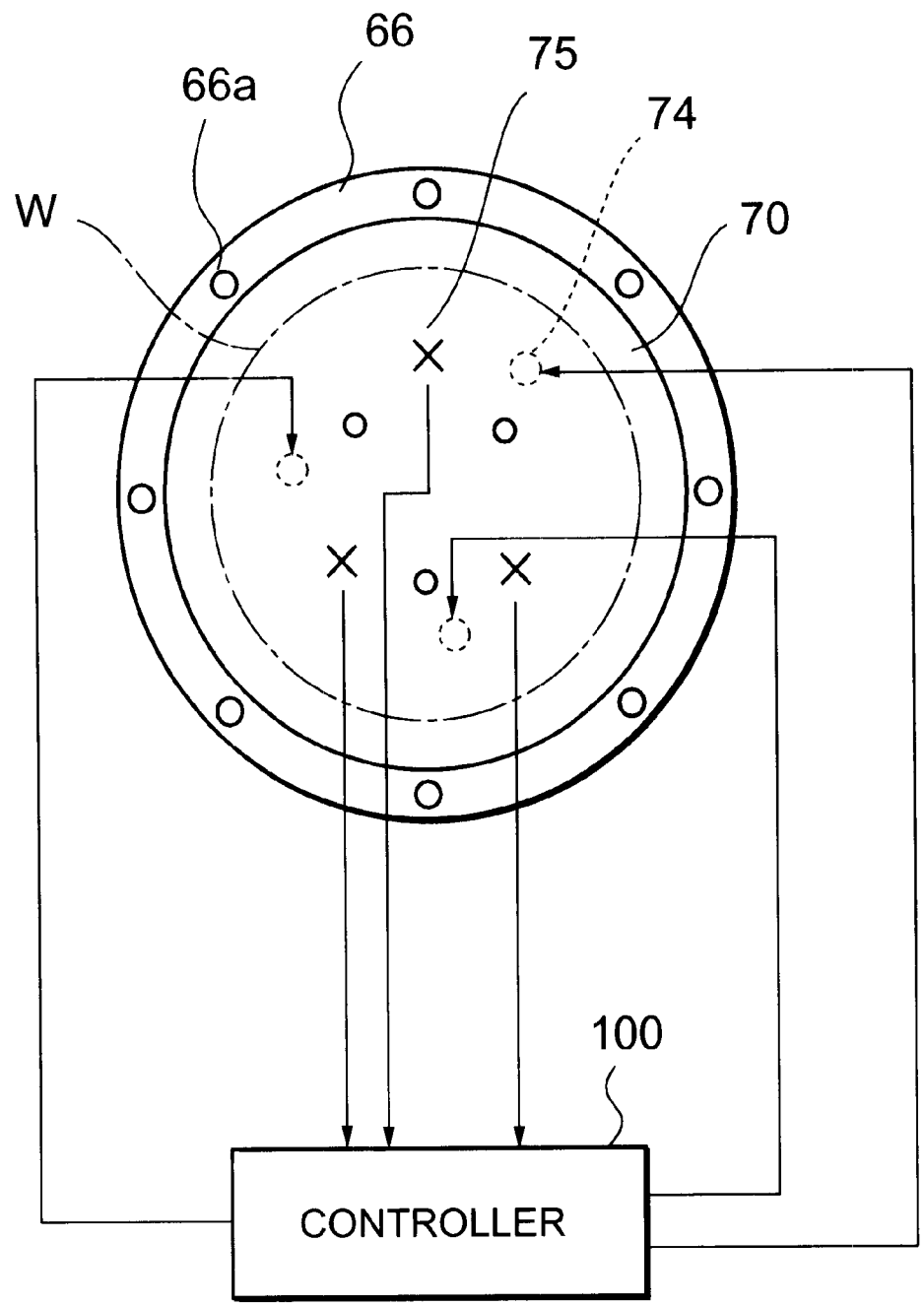
FIG. 13 is a plan view explaining a heating unit in a heating and cooling processing unit according to yet another embodiment.

Further, in the aforesaid embodiment, since the nozzles 74 communicate with one another by the same air supply pipe 76, air with the same air velocity is blown onto the rear face of the hot plate 70. As shown in FIG. 13, however, it is possible to provide a controller 100, to which the temperature information of the hot plate 70 measured by the sensors 75 is sent, for controlling the discharge quantity of air to be discharged from the nozzles 74 and the period of time to let the air flow based on this information to thereby change the discharge quantity and time of air to be discharged from the nozzles 74. The aforesaid provision of the controller 100 enables temperature distribution in the surface of the hot plate 70 to be made more uniform. Incidentally, for easier understanding, the number of the nozzles 74 and the sensors 75 are reduced in FIG. 13.

It should be mentioned that in the aforesaid FIG. 8 to FIG. 13, the same numerals and symbols are given with regard to the same structure as in the aforesaid embodiment.

Furthermore, although constant temperature circulating water is used as a cooling medium circulating in the cooling plate 93 in the aforesaid embodiment, gas such as dry air or the like can be used. Compared with liquids, gas is less expensive, has no leakage like liquid, and can flow smoothly unlike liquids.

Next, still another embodiment of the present invention will be explained.

Figure 14:
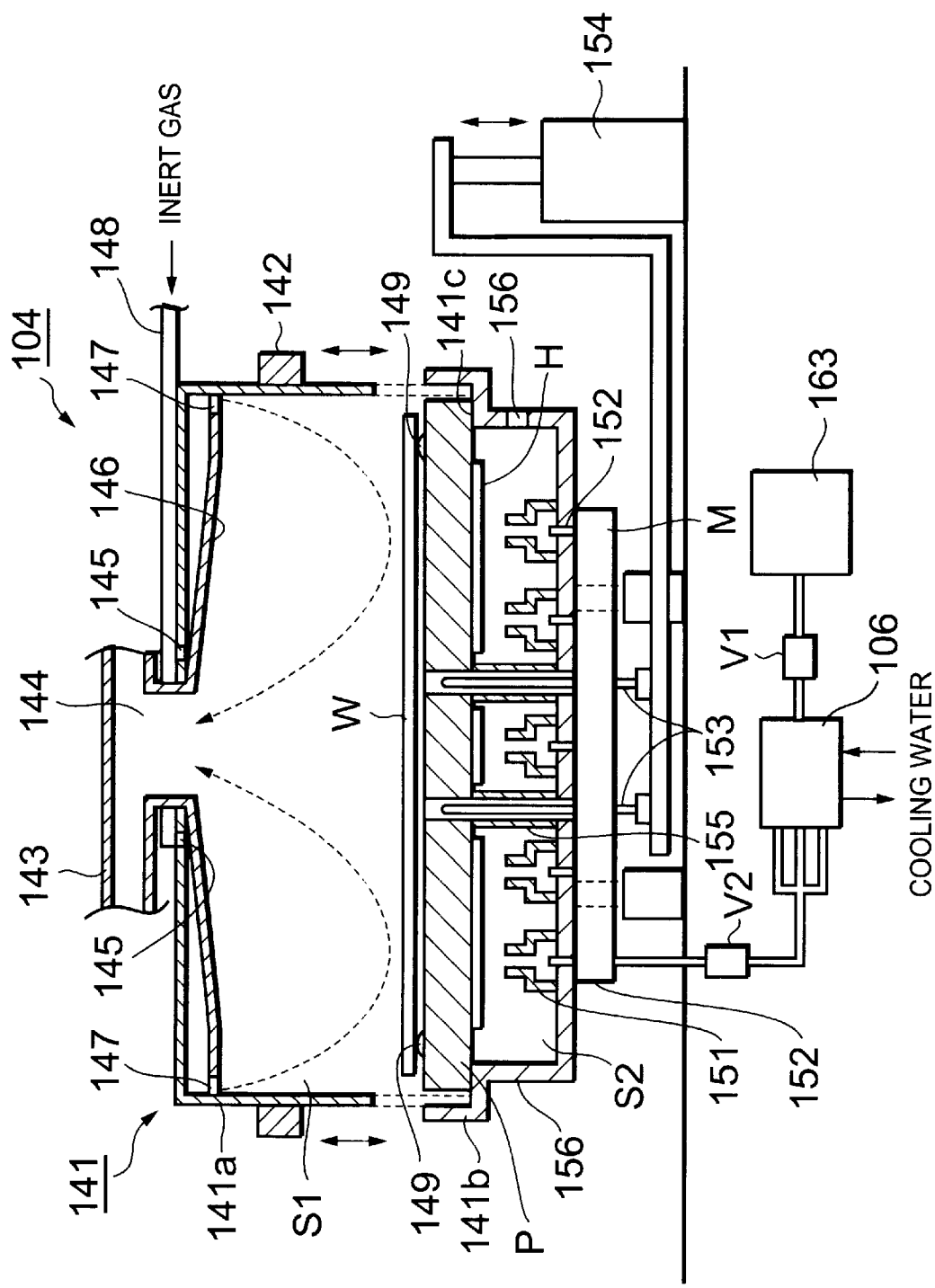
FIG. 14 is a sectional view showing an example of a heat processing unit according to still another embodiment of the present invention.

FIG. 14 is a sectional view showing the structure of a heat processing unit 104 according to this embodiment.

Figure 15:
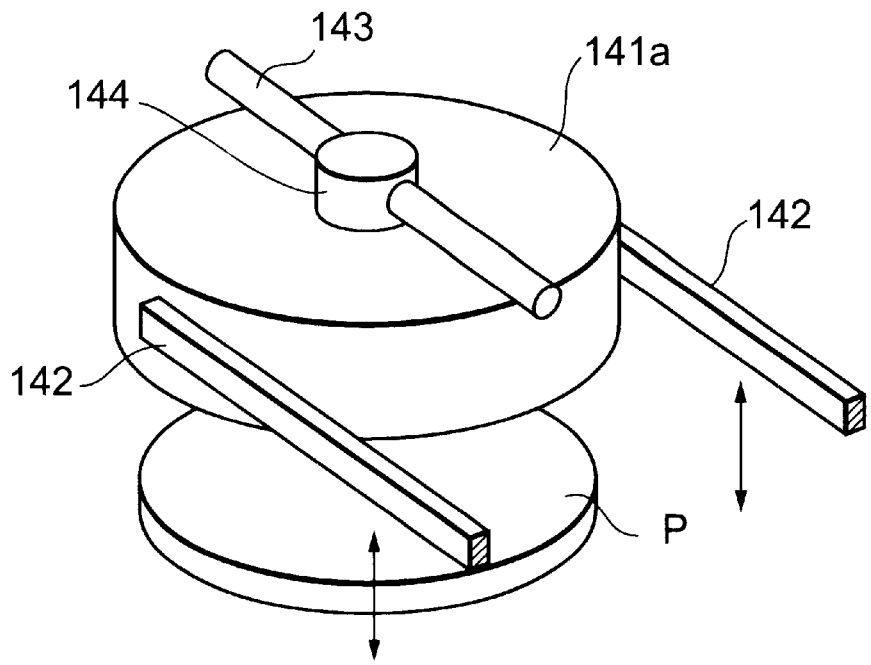
FIG. 15 is a perspective view showing a lid body of the heat processing unit in FIG. 14.

The numeral 141 here is an almost cylindrical processing container composed of a lid body 141a and a lower container 141b, and the lid body 141a enters the inside of the side wall of the lower container 141b to form an enclosed space within the container 141. For example, as shown in FIG. 15, the side of the lid body 141a is supported by support arms 142, and the lid body 141a can be freely raised and lowered by a raising and lowering mechanism not illustrated.

An exhaust port 144 connected to an exhaust pipe 143 is provided in the center of the lid body 141a, and a plurality of gas supply holes 145 are formed, for example, in a circumferential direction around the exhaust port 144. Seen from within, the top of the lid body 141a slopes gently so as to be elevated gradually from the outside to the center. A plurality of gas supply holes 147 are formed in an circumferential direction in the outer edge of this slope 146. The numeral 148 in FIG. 14 is a gas supply pipe for supplying an inert gas such as nitrogen gas or argon gas as a purge gas. Incidentally, in FIG. 15, the gas supply pipe 148 and the gas supply holes 147 are omitted for the convenience of illustration.

The lower container 141b is formed so that a step 141c protrudes inward. A disc-shaped hot plate P, for example, made of aluminum or ceramics is provided on this step 141c in such a manner that a peripheral edge region of the plate P is held by the step 141c.

A plurality of, for example, three projections 149, for example, made of ceramics for holding the wafer W while the wafer W is, for example, 0.1 mm to 0.5 mm lifted off the hot plate P are provided on the front face of hot plate P. The reason why the wafer W is held while being lifted slightly off the hot plate P is the prevention of contamination of the rear face of the wafer by particles. A heater H, for example, made of Nichrome wire or sintered metal is provided on the rear face of the hot plate P, and the plate P is heated to a predetermined temperature by being heated by this heater H.

When the lid body 141a is closed, two spaces are respectively formed above and below the hot plate P inside the heat processing unit 104. Namely, one space enclosed by the hot plate P and lid body 141a is a heat processing chamber S1, and the other space enclosed by the hot plate P and the lower container 141b is a cooling chamber S2.

A plurality of nozzles 151 for blowing a cooling gas such as air or nitrogen gas onto the rear face of the hot plate P are provided in the cooling chamber S2. Connected to the respective nozzles 151 are branch ends of cooling gas supply pipes 152 which constitute a cooling gas channel which is branched by a manifold M provided outside the lower container 141b.

A plurality of, for example, three ascending and descending pins 153 for raising and lowering the wafer W when the wafer W is delivered onto the projections 149 are provided so as to penetrate the cooling chamber S2 and the hot plate P. These ascending and descending pins 153 can be freely raised and lowered by a raising and lowering mechanism 154 provided outside the heat processing unit 104. The numeral 155 in FIG. 14 is a guide member for raising and lowering the ascending and descending pin 153 without the ascending and descending pin 153 being hindered by wires of the heater H and the like, and the numeral 156 is an exhaust port for the cooling gas.

Thus, in the heat processing chamber S1, a stream of a hot atmosphere shown by a dotted line in FIG. 14 is generated by a purge gas composed of the inert gas supplied from the gas supply pipe 148 via the gas supply holes 145 and 147. In the cooling chamber S2, the cooling gas is blown onto the rear face of the hot plate P from the nozzles 151 through the cooling gas supply pipes 152, and the hot plate P is cooled to a predetermined temperature, and the temperature of the plate P is thus regulated.

Figure 16:
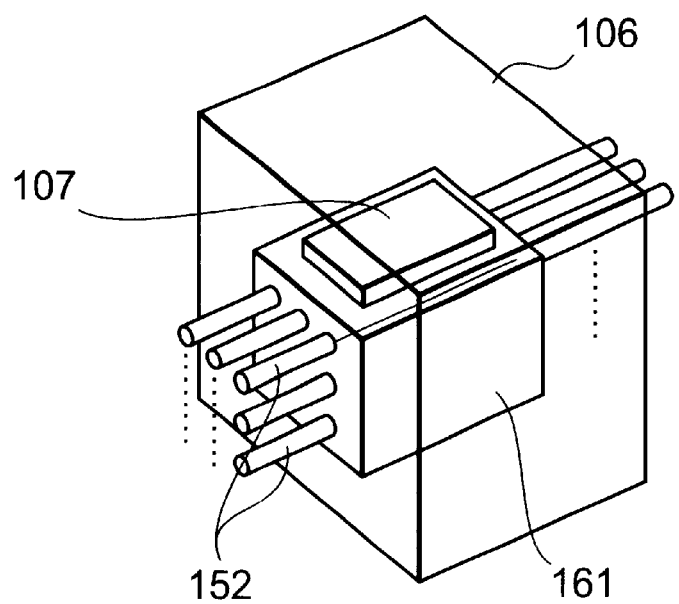
FIG. 16 is a perspective view showing a cooling device provided in the heat processing unit in FIG. 14.

The present invention is characterized by the use of a low-temperature cooling gas on the occasion of such temperature regulation that the temperature of the hot plate P is lowered. Then, a cooling mechanism for obtaining such a low-temperature cooling gas will be explained based on FIG. 16 and FIG. 17. The numeral 106 is a cooling device which utilizes a Peltier element, and the numeral 161 is a box-shaped cooling container formed out of a material with good thermal conductivity such as very thin Teflon or metal. In this cooling container 161, the cooling gas supply pipes 152 are provided so as to penetrate the container 161 while branching off in plurality. A refrigerant 160 such as water is contained in the container 161. A portion of each of the cooling gas supply pipes 152, which touches the refrigerant 160 in the container 161, is made of a material with good thermal conductivity such as aluminum or copper. The downstream side of the cooling gas supply pipe 152 may be provided with a heat insulator at its outer periphery in order to prevent dew formation.

A Peltier element 107 constituting a cooling module is provided so as to touch the cooling container 161 on one outer face of the cooling container 161, and a cooling pipe 162 constituting a cooling path is provided so as to touch the element 107 on another face side (the side which does not touch the container 161) of the Peltier element 107. In this example, two Peltier elements 107 are respectively provided at the top and bottom of the container 161, for example, so that the container 161 is sandwiched between them, and two cooling pipes 162 are provided outside the Peltier elements 107 respectively.

Figure 17:
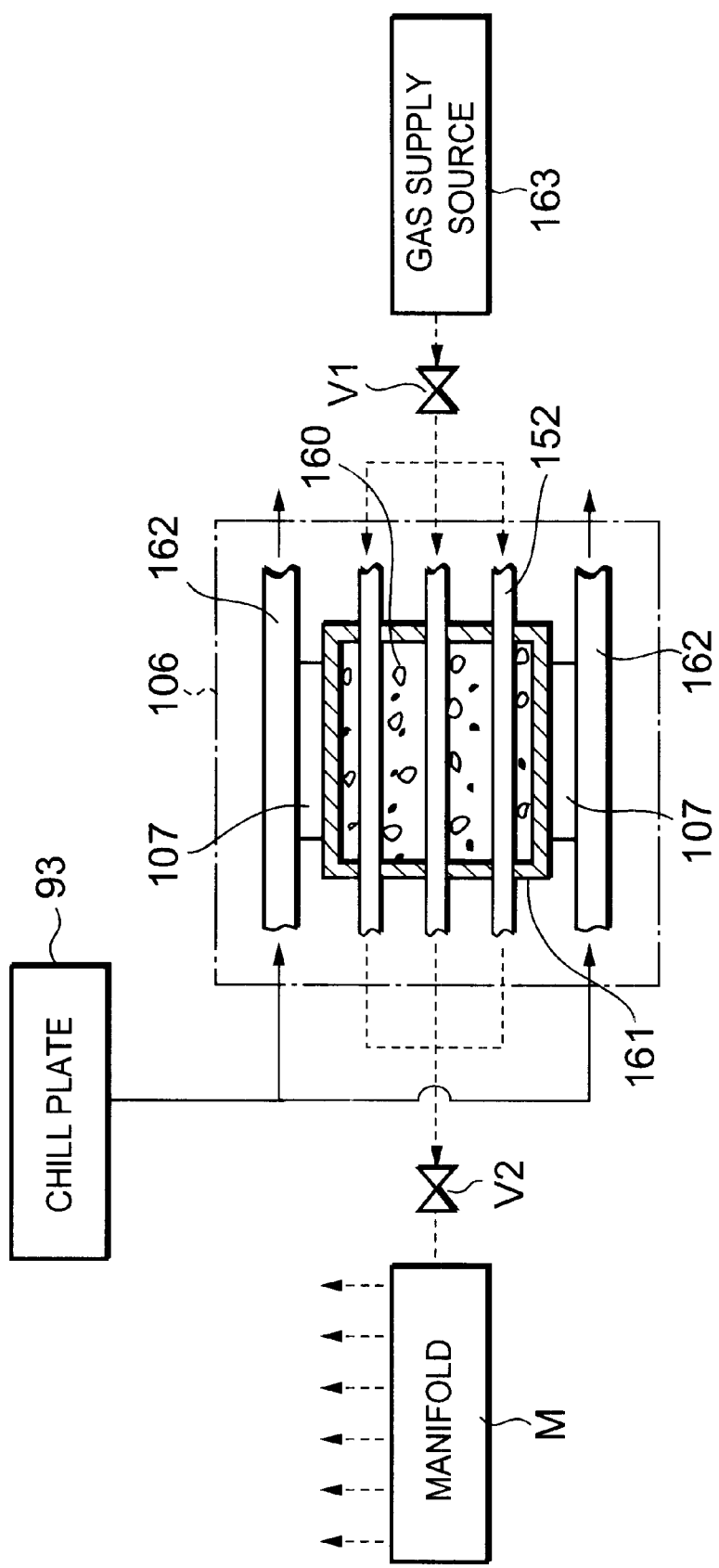
FIG. 17 is a sectional view showing the cooling device in FIG. 16.

The gas supply pipes 152 divergently penetrate the cooling container 161 in order to enhance cooling efficiency, but as shown in FIG. 17, they are united upstream of the cooling container 161 and connected to a cooling gas supply source 163 via an on-off valve VI, and they are also united downstream of the cooling container 161 and connected to the manifold M via an on-off valve V2. Cooling water, for example, with a temperature of 20° C. cooled by the chill plate 93 (See FIG. 3) is supplied to each of the cooling pipes 162 while circulating.

Figure 18:
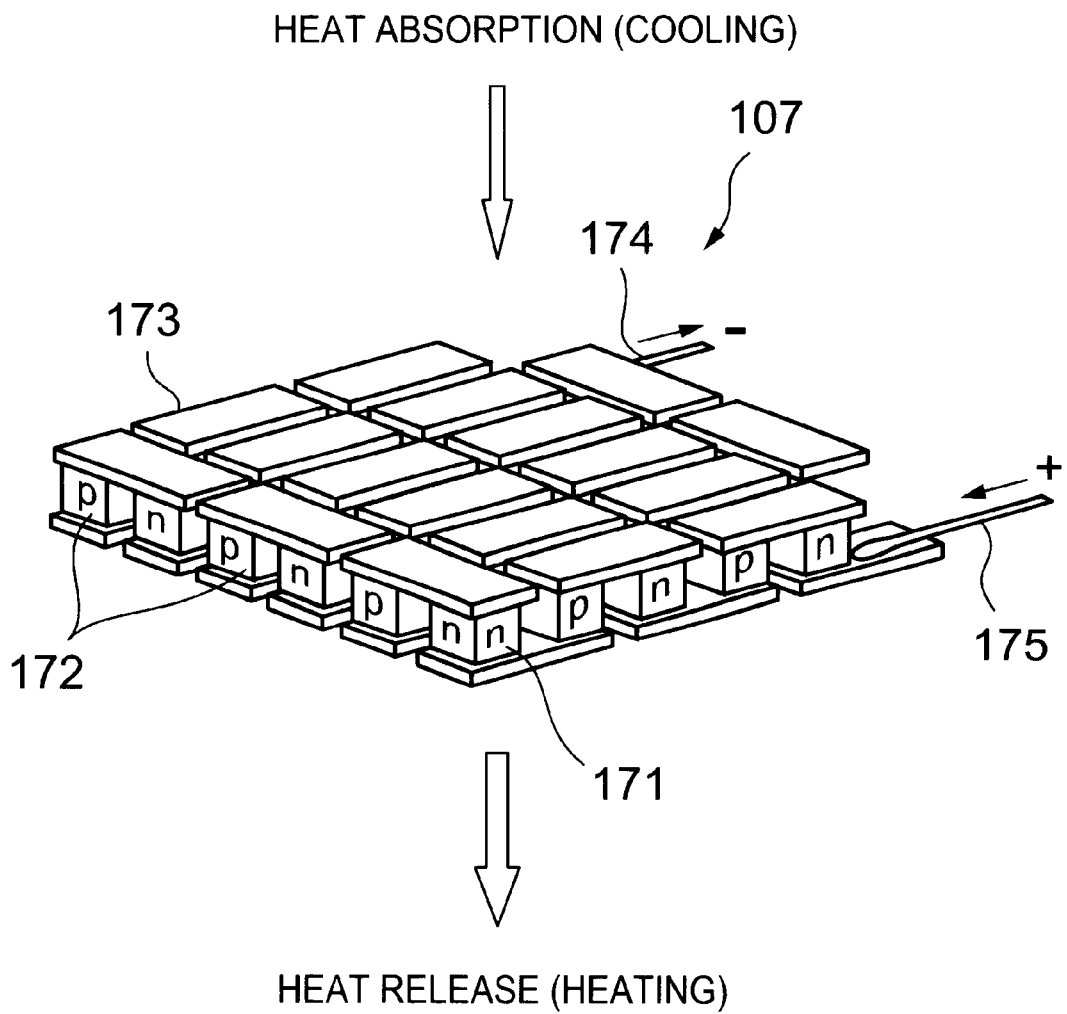
FIG. 18 is a perspective view showing a Peltier element provided in the cooling device in FIG. 17.

Next, the Peltier element 107 will be explained in brief. This element is a kind of thermoelectric module and means a semiconductor device in which temperature difference occurs between both faces of the device, heat absorption occurs on the low temperature side, and in which heat release occurs on the high temperature side. For example, as shown in FIG. 18, an N-type semiconductor 171 and a P-type semiconductor 172 are bonded by a metal electrode 173, and the Peltier element 107 has a structure in which these couples are connected in series. In FIG. 18, the numeral 174 denotes a P-type electrode, and the numeral 175 denotes an N-type electrode.

The principle of cooling by this Peltier element 107 will be explained in brief. One face of the element 107 is brought into contact with an object to be cooled, a minus voltage is applied to the P-type electrode 174, and a plus voltage is applied to the N-type electrode 175. In this case, when electrons given from a power source move into the P-type semiconductor 172, the semiconductor 172 is in a state of a shortage of electrons. Hence, the electrons move to the lower energy level, and energy is radiated outward. As for the N-type semiconductor 171, similarly, when electrons move into the N-type semiconductor 171, energy is adsorbed from the outside, and when they goes out, energy is radiated. Thus, heat absorption is performed from one face side of the element 107, and a quantity of heat corresponding to (absorbed heat quantity+Joule heat) is released from the other face side. Thereby, if heat on the heat release side is efficiently released, heat continuously moves from the heat absorption side (low temperature side) to the heat release side (high temperature side), and consequently the object to be cooled is cooled to a predetermined temperature.

Accordingly, if the one face of the Peltier element 107 is brought into contact with the cooling container 161 which is the object to be cooled, the other face is brought into contact with the cooling pipe 162, and a voltage is applied as described above, heat of the cooling container 161 is absorbed through the one face side of the element 107, and heat released from the other face side of the element 107 is absorbed by the flow of cooling water in the cooling pipe 162. Water in the cooling container 161 is cooled by this movement of heat. If the cooling container is thus cooled, water in the container turns to ice at a temperature of a solidifying point or lower, and moreover turns to ice with a lower temperature if the temperature falls further.

Inside the cooling container 161, the gas supply pipes 152 are cooled with ice obtained by cooling water, and by letting cooling gas flow in the supply pipe 152, the cooling gas is cooled. On this occasion, the temperature of ice in the cooling container 161 is preferably approximately 0° C. to −60° C., for example, about −40° C. since the temperature of the cooling gas is not lowered if the temperature of ice is excessively high, which makes it difficult to enhance cooling efficiency, and meanwhile if it is excessively low, the cooling gas forms dewdrops. In the cooling device 106, ice having a predetermined temperature or a liquid having a low temperature can be produced by regulating a drive current of the Peltier element 107. The size of the cooling container 161 is set in consideration of expansion when water is cooled to turn into ice.

Heat processing after exposure is performed by the heat processing unit 104 structured as above. In this heat processing, for example, the lid body 141a of the heat processing unit 104 is raised to thereby open the container 141, and the wafer W is carried therein. In the container 141, while the ascending and descending pins 153 protrude from the projections 149 of the hot plate P, the wafer W is delivered onto the ascending and descending pins 153. Thereafter, the ascending and descending pins 153 are lowered, and thereby the wafer W is supported by the projections 149. The lid body 141a is then closed.

The inert gas is introduced from the gas supply pipe 148 via the gas supply holes 145 and 147 to generate a stream of hot atmosphere in the heat processing chamber S1. Meanwhile, electric power is supplied to the heater H to heat the hot plate P to 150° C. which is a first temperature, whereby predetermined heat processing is performed for the wafer W. After the supply of the inert gas is stopped and the lid body 141a is opened, the wafer W subjected to the heat processing is delivered to the main transfer device 16 by cooperative operation with the ascending and descending pins 153.

In the coating and developing apparatus, resist pattern forming processing is performed for, for example, 200 wafers W. During this processing, in the heat processing unit 104, the cooling container 161 is cooled and ice with a predetermined temperature is made in the cooling device 106. Namely, the cooling container 161 is cooled by supplying predetermined electric power is to the Peltier elements 107 and letting cooling water with a predetermined flow rate and a predetermined temperature flow in the cooling pipes 162, whereby water in the container 161 is solidified, thereby making ice having a predetermined temperature, for example, −40° C.

One example of the conditions for making ice with a temperature of −40° C. is as follows. When the cooling container 161 made of Teflon resin with an internal volume of 40 cc and the 20 W class of Peltier element 107 are used, a cooling capacity (Peltier efficiency) of this Peltier element 107 is set at 10%, and water with a temperature of 20° C. is used as primary cooling water, it takes about 50 minutes to turn 10 cc of water with a temperature of 20° C. into ice with a temperature of −40° C.

After the formation of a resist pattern is thus performed for a predetermined number of wafers W, a first reticle in the aligner is exchanged for a second reticle. Meanwhile, during this exchange, the temperature of the hot plate P is regulated in the heat processing unit 104. Namely, the valves V1 and V2 are opened, and the cooling gas, for example, composed of air is run into the gas supply pipes 152. The gas supply pipes 152 are cooled by the −40° C. ice, and therefore the cooling gas is cooled to, for example, about −30° C. by flowing through these gas supply pipes 152. This gas is then branched by the manifold M, supplied to the nozzles 151, and herefrom blown onto the rear face of the hot plate P at a predetermined discharge quantity, for example, 20 liters/minute to thereby cool the hot plate P to a second temperature (100° C.) which is lower than the first temperature in about two minutes.

After the temperature regulation of the hot plate P is completed during the exchange of reticles, resist pattern forming processing is performed for a predetermined number of wafers W through the use of the second reticle by the aforesaid process.

According to this embodiment, a refrigerant with a predetermined temperature, for example, ice with a temperature of −40° C. is made by utilizing the Peltier element 107, and the cooling gas flows in the gas supply pipes 152 cooled by the ice, whereby the temperature of the cooling gas can be lowered to about −30° C. Therefore, this low-temperature cooling gas is blown onto the hot plate P to cool the same, thereby improving the cooling efficiency of the plate P, leading to a reduction in cooling time.

On this occasion, the ice with the predetermined temperature, for example, about −40° C. can be made by the Peltier element 107, whereby the cooling gas can be fully cooled while dew formation is prevented. Moreover, the cooling container 161 and the portion of each of the gas supply pipes 152 touching the refrigerant inside the cooling container 161 is formed out of a material with good thermal conductivity, whereby the refrigerant and the gas supply pipes 152 can be cooled efficiently.

When a cooling gas with a temperature of 20° C. is used as in prior arts, the cooling time of the hot plate P can be shortened by increasing the discharge quantity of gas to be blown onto the hot plate P, but if a reduction in the cooling time of the plate P to half compared with the prior arts is tried, not less than ten times the discharge amount of that one is required, and hence this method is impractical.

The cooling of the hot plate P is performed when because of an exchange of reticles, the temperature of the hot plate P after exposure in a process after the exchange is lower than that in a process before the exchange, and thus the cooling gas is intermittently blown out toward the hot plate P when all the processes are considered. On this occasion, the refrigerant with the predetermined temperature can be made in about 50 minutes at the longest in the cooling device 106, and the time required to perform resist pattern forming processing for 200 wafers W in the aforesaid apparatus is about 200 minutes. Accordingly, the cooling device 106 need not be operated throughout the processes, and a reduction in the cost of electric power can be obtained if the refrigerant is made before the cooling by the cooling gas. Meanwhile, considering that the gas is cooled by a cooling device, for example, provided with a heat exchanger or the like, the cooling device usually needs to be operated at all times, which is wasteful in terms of energy.

when, because of an exchange of reticles, the temperature of the hot plate P after exposure in a process after the exchange is lower than that in a process before the exchange as described above, the refrigerant with the predetermined temperature can be made in the cooling device 106 while resist pattern forming processing is performed by the use of the first reticle before the exchange. As a result, from a standpoint of a resist pattern forming apparatus, the time required to wait for the refrigerant to be made is unnecessary.

When the cooling gas cooled by the refrigerant with the predetermined temperature is used, the temperature of the hot plate P can be lowered, for example, from 150° C. to 100° C. in about two minutes as described above. Hence, the temperature of the hot plate P can be fully regulated during the exchange of reticles which requires about three minutes. This eliminates the time to wait for temperature regulation of the hot plate P, resulting in improvement in throughput. The difference between heating temperatures after exposure is usually about 110° C., and in this range of difference, the temperature can be regulated within the exchange time.

In the aforesaid embodiment, the refrigerant with the predetermined temperature in the cooling container 161 is not limited to ice, but the use of ice as the refrigerant is advantageous since even if cooling is stopped after ice is cooled to the predetermined temperature, the ice can be kept in this state and kept at the temperature for some time. When a liquid is used as the refrigerant, the temperature of the liquid gradually rises if cooling is stopped, and its increase speed is rapid. In the aforesaid example, after −40° C. ice is made, cooling may be stopped temporarily, in which case electric power can be further reduced.

In the present invention, in addition to water, alcohol such as ethanol, a mixed solution of water with a melting point of −21.2° C. and sodium chloride, a mixed solution of water with a melting point of −30° C. and ethanol, and the like can be used as the refrigerant, in which case the refrigerant may be a liquid or a solid. Moreover, although the cooling gas from the cooling gads supply pipes 152 is blown onto the hot plate P via the nozzles 151 in the aforesaid example, the cooling gas may be blown onto the hot plate P directly from the cooling gas supply pipes 152.

Further, in the cooling device 106, the Peltier elements 107 may be stacked in multiple tiers. In this case, the heat release side of the Peltier element 107 on the cooling container 161 side is cooled by a Peltier element adjacent thereto. When the Peltier elements 107 are stacked in multiple tiers as described above, the cooling pipe 162 for cooling the heat release side of the Peltier element 107 need not be provided specially.

Figure 19:
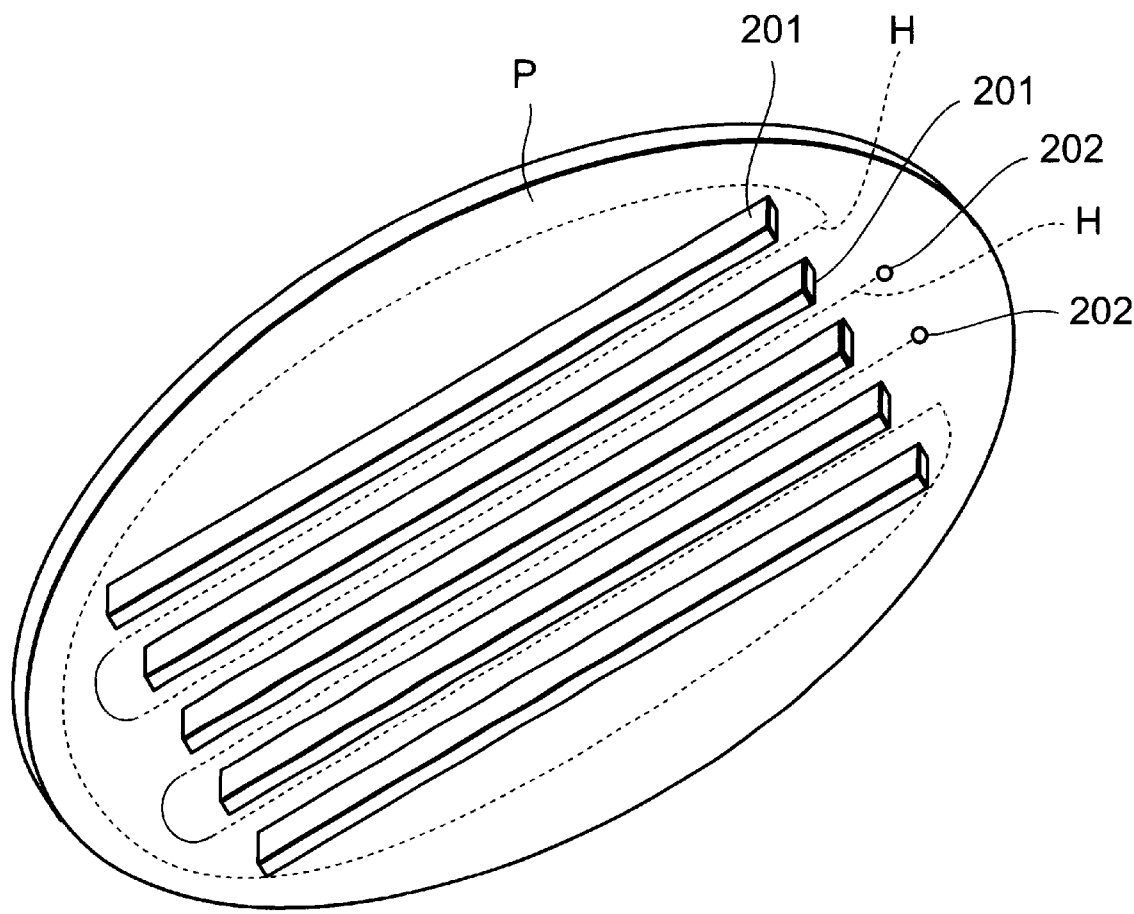
FIG. 19 is a perspective view showing an example of modification of FIG. 14.
Figure 20:
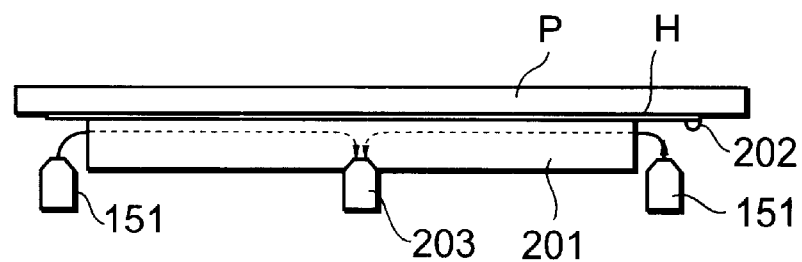
FIG. 20 is a front view of FIG. 19.

Furthermore, although the exhaust port 156 for the cooling gas is provided in the outer periphery of the cooling chamber S2, the exhaust port may be provided near the rear face of the hot plate P, and a cooling gas channel may be provided as desired. FIG. 19 is a perspective view showing an example thereof, and FIG. 20 is a front view thereof. Guide walls 201 for forming a cooling gas channel are provided on the rear face of the hot plate P. These guide walls 201 are provided to partition off the adjacent heaters H. Namely, each of the guide walls 201 is disposed midway between the adjacent heaters H. Each of the nozzles 151 is provided closest to an electrode 202 (at a position where an electric wire is connected) of the heater H, that is, at a position where the cooling gas jetted from the nozzle 151 directly hits the electrode 202 of the heater H. The respective nozzles 151 are disposed on one side of the rear face of the hot plate P, and an exhaust nozzle 203 is disposed on the other side. An exhaust pump the illustration of which is omitted is connected to the exhaust nozzle 203. Therefore, the cooling gas jetted from the nozzles 151 is collected by the exhaust nozzle 203 after passing through a space between the guide walls 151, that is, passing over the heater H. Thereby, the cooling gas which rises in temperature to some extent does not stay on the rear face side of the hot plate P, resulting in efficient cooling. Moreover, the cooling gas passes along the heater H, whereby cooling efficiency is further raised.

In addition, the cooling gas jetted from the nozzle 151 directly hit the electrode 202 of the heater H where the temperature is especially high, which makes it possible to still further raise cooling efficiency.

Figure 21:
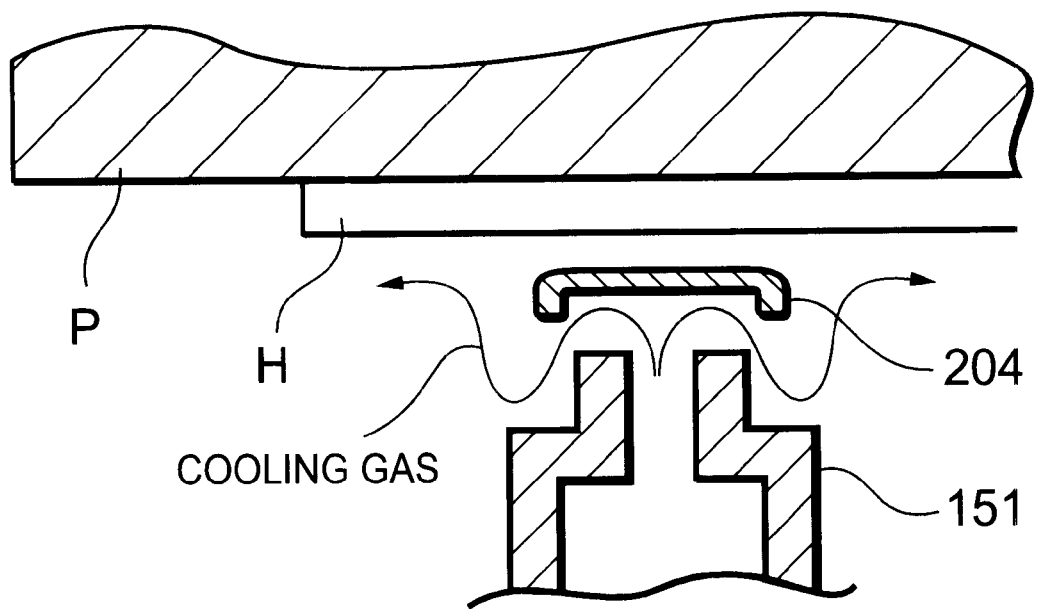
FIG. 21 is a partial sectional view showing another example of modification of FIG. 14.

In any of the embodiments, the cooling gas jetted from the nozzles is directly blown onto the rear face of the hot plate P, but as shown in FIG. 21, a reflecting plate 204 may be disposed a predetermined distance away from the tip of the nozzle 151. This reflecting plate 204 reflects the cooling gas jetted from the nozzle 151 to lengthen the substantial cooling gas channel from the nozzle 151 to the rear face of the hot plate P and to make the flow of the cooling gas turbulent, thereby enhancing cooling efficiency.

Moreover, also in the embodiment shown in FIG. 18 to FIG. 21, the black plate shown in FIG. 3 is naturally applicable.

Furthermore, in the present invention, the heat processing unit which performs heating after exposure needs only to have the aforesaid structure, and hence heating before and after resist coating or the like may be performed by a conventional heat processing unit or by the heat processing unit of the present invention. Moreover, in the present invention, a substrate is not limited to the wafer, and a glass substrate for a liquid crystal display is also available.

As described above, according to the present invention, the hot plate can be cooled in a short time, which leads to a rise in throughput.

The disclosure of Japanese Patent Application No.2000-112251 filed Apr. 13, 2000 and No.11-227512 filed Aug. 11, 1999, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A method for processing a substrate, comprising the steps of:

heating a hot plate for placing the substrate thereon and heating the substrate; and positioning an object of which a portion facing the hot plate has a color with good heat absorption efficiency above the hot plate.

2. The method as set forth in claim 1, further comprising the steps of:

placing the substrate on the hot plate and heating the substrate after the step of heating the hot plate; and removing the substrate from the top of the hot plate after the step of heating the substrate, wherein after the step of removing the substrate from the top of the hot plate, the object of which the portion facing the hot plate has the color with good heat absorption efficiency is positioned above the hot plate.

3. The method as set forth in claim 1, further comprising the step of:

blowing a cooling gas onto a rear face of the hot plate after the step of heating the hot plate.

4. The method as set forth in claim 1, wherein the color with good heat absorption efficiency is a color having a JIS lightness of 0V to 4V.

5. The method as set forth in claim 1, wherein a cooling medium circulates in the object, and the object is situated to touch the hot plate.

6. A heat processing apparatus, comprising:

a hot plate for heating a substrate;

a heater disposed to be integrated structurally with the hot plate and;

a nozzle for blowing a cooling gas onto a rear face of the hot plate.

7. The heat processing apparatus, as set forth in claim 6, further comprising:

an object moving freely over the hot plate, of which a face opposite the hot plate has a color with good heat absorption efficiency.

8. The apparatus as set forth in claim 7, wherein the object is allowed to move so that the hot plate and the face opposite the hot plate touch.

9. The apparatus as set forth in claim 7, wherein the color with good heat absorption efficiency is practically a color having a JIS lightness of 0V to 4V.

10. The apparatus as set forth in claim 7, wherein a channel for a cooling medium is formed in the object.

11. The apparatus as set forth in claim 10, wherein the cooling medium is a liquid.

12. The apparatus as set forth in claim 10, wherein the cooling medium is a gas.

13. The apparatus as set forth in claim 7, wherein the face opposite the hot plate of the object is formed into a roughened surface.

14. The apparatus as set forth in claim 7, wherein the object is a transfer device for transferring the substrate.

15. The apparatus as set forth in claim 7, wherein the face opposite the hot plate of the object is shaped almost exactly into a flat plate to cover the hot plate.

16. The apparatus as set forth in claim 7, further comprising:

a nozzle for blowing a cooling gas onto a rear face of the hot plate.

17. The apparatus as set forth in claim 16, further comprising:

a temperature sensor for measuring a temperature of the hot plate, wherein a position at which the cooling gas is blown out from the nozzle is set at a position away from the temperature sensor.

18. The apparatus as set forth in claim 16, wherein the nozzles are provided in plurality, the apparatus, further comprising:

a plurality of temperature sensors each for measuring a temperature of the hot plate; and a controller, to which measurement information measured by the temperature sensors is sent, for controlling a quantity of a gas to be discharged from each of the nozzles based on the measurement information.

19. The apparatus as set forth in claim 16, further comprising:

a processing chamber, in which the hot plate is disposed, having spaces in an upper and lower portions thereof with the hot plate between them;

an exhauster for performing exhaust operation from within the lower portion of the processing chamber, wherein the cooling gas is supplied to the lower portion of the processing chamber, and a quantity of the cooling gas discharged from the nozzle is larger than an exhaust quantity from the exhauster.

20. An apparatus for performing heat processing for a substrate, comprising:

a plate for holding the substrate;

a heater for heating the plate;

a cooling container containing a refrigerant;

a cooling module, disposed to touch at least one face of the cooling container, for absorbing a heat from the cooling container to cool the refrigerant in the cooling container to a predetermined temperature by a Peltier effect;

a supply source of a cooling gas;

a cooling gas channel connected to the supply source, a portion of which is provided to touch the refrigerant in the cooling container and cooled by touching the refrigerant; and a nozzle for jetting the cooling gas which has passed through the cooling gas channel toward the plate.

21. The apparatus as set forth in claim 20, wherein a cooling path is provided to touch a face other than the face touching the cooling container of the cooling module, and the heat from the cooling container absorbed by the Peltier effect is released to the cooling path.

22. The apparatus as set forth in claim 20, wherein the refrigerant is a solid.

23. The apparatus as set forth in claim 20, wherein the refrigerant is a water.

24. The apparatus as set forth in claim 20, further comprising:

an object moving freely over the plate, of which a face opposite the plate has a color with good heat absorption efficiency.

25. The apparatus as set forth in claim 20, wherein the nozzle jets the cooling gas toward a rear face of the plate, the apparatus, further comprising:

a guide wall, disposed on the rear face of the plate, for guiding the cooling gas jetted from the nozzle along a predetermined channel.

26. The apparatus as set forth in claim 25,
wherein the heater is provided to have portions which are disposed at least parallel to one another on the rear face of the plate, and
wherein the guide wall is provided to partition off the portions adjacent to each other of the heater.

27. The apparatus as set forth in claim 25,
wherein the heater has a wiring connector, and
wherein the nozzle is provided to jet the cooling gas directly to the wiring connector.

28. The apparatus as set forth in claim 20,
wherein the nozzle jets the cooling gas toward a rear face of the plate,
the apparatus, further comprising:
 a reflector for reflecting the cooling gas jetted from the nozzle.

29. An apparatus for forming a resist pattern on a substrate, comprising:
 a coating processing unit for coating a front face of the substrate with a resist;
 a developing processing unit for supplying a developing solution to the front face of the substrate subjected to exposure to develop the same;
 a heat processing unit for heating the substrate after exposure to a predetermined temperature; and
 a substrate carrier for transferring the substrate between the coating processing unit, the developing processing unit, and the heat processing unit,
 the heat processing unit, comprising:
  a plate for holding the substrate;
  a heater for heating the plate;
  a cooling container containing a refrigerant;
  a cooling module, disposed to touch at least one face of the cooling container, for absorbing a heat from the cooling container to cool the refrigerant in the cooling container to a predetermined temperature by a Peltier effect;
  a supply source of a cooling gas;
  a cooling gas channel connected to the supply source, a portion of which is provided to touch the refrigerant in the cooling container and cooled by touching the refrigerant; and
  a nozzle for jetting the cooling gas which has passed through the cooling gas channel toward the plate.

30. The apparatus as set forth in claim 29, further comprising:
 an interface unit for connecting with an aligner for performing exposure processing for the substrate coated with the resist by use of a predetermined reticle.

31. A method for forming a resist pattern on a substrate, comprising:
 a first resist pattern forming step of performing exposure processing for a substrate coated with a resist by use of a first reticle, heating the exposed substrate by a hot plate heated to a first temperature, and thereafter supplying a developing solution to a front face of the substrate to develop the same;
 a second resist pattern forming step of performing exposure processing for a substrate coated with the resist by use of a second reticle, heating the exposed substrate by the hot plate heated to a second temperature lower than the first temperature, and thereafter supplying the developing solution to a front face of the substrate to develop the same;
 a step of exchanging the first reticle for the second reticle, which is performed between the first resist pattern forming step and the second resist pattern forming step;
 a step of absorbing a heat from a cooling container by a Peltier effect of a cooling module to cool a refrigerant in the cooling container to a predetermined temperature; and
 a step of providing a cooling gas channel so that the cooling gas channel touches the refrigerant in the cooling container and supplying a cooling gas which is cooled by flowing through the cooling gas channel to the hot plate to lower the temperature of the hot plate from the first temperature to the second temperature.

32. A method for forming a resist pattern on a substrate, comprising:
 a first resist pattern forming step of performing exposure processing for a substrate coated with a resist by use of a first reticle, heating the exposed substrate by a hot plate heated to a first temperature, and thereafter supplying a developing solution to a front face of the substrate to develop the same;
 a second resist pattern forming step of performing exposure processing for a substrate coated with the resist by use of a second reticle, heating the exposed substrate by the hot plate heated to a second temperature lower than the first temperature, and thereafter supplying the developing solution to a front face of the substrate to develop the same;
 a step of exchanging the first reticle for the second reticle, which is performed between the first resist pattern forming step and the second resist pattern forming step;
 a step of absorbing a heat from a cooling container by a Peltier effect of a cooling module to cool a refrigerant in the cooling container to a predetermined temperature, which is performed during the first resist pattern forming step; and
 a step of providing a cooling gas channel so that the cooling gas channel touches the refrigerant in the cooling container and supplying a cooling gas which is cooled by flowing through the cooling gas channel to the hot plate to lower the temperature of the hot plate from the first temperature to the second temperature, which is performed during the step of exchanging the reticles.

33. A processing apparatus comprising:
 a heat processing apparatus having a hot plate for heating a substrate, a heater disposed to be integrated structurally with the hot plate, and a nozzle for blowing a cooling gas onto a rear face of the hot plate; and
 a transfer mechanism transferring the substrate from an aligner to the heat processing apparatus.

* * * * *